(12) United States Patent
Koyama et al.

(10) Patent No.: US 9,755,136 B2
(45) Date of Patent: *Sep. 5, 2017

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Shinya Koyama, Tokyo (JP); Yasushi Shimizu, Fujisawa (JP); Makoto Kubota, Yokohama (JP); Akira Uebayashi, Tokyo (JP); Hidenori Tanaka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 58 days.

This patent is subject to a terminal disclaimer.

(21) Appl. No.: 14/066,992

(22) Filed: Oct. 30, 2013

(65) Prior Publication Data

US 2014/0124695 A1 May 8, 2014

(30) Foreign Application Priority Data

Nov. 2, 2012 (JP) ................................ 2012-242894

(51) Int. Cl.
*H01L 41/187* (2006.01)
*C04B 35/468* (2006.01)
(Continued)

(52) U.S. Cl.
CPC .......... *H01L 41/1871* (2013.01); *B08B 7/02* (2013.01); *B41J 2/14233* (2013.01);
(Continued)

(58) Field of Classification Search
CPC . C04B 35/462; C04B 35/468; C04B 35/4682; C04B 35/499; C04B 2235/3206;
(Continued)

(56) References Cited

U.S. PATENT DOCUMENTS 4,988,468 A * 1/1991 Nishioka et al. ............. 264/658
9,166,140 B2 * 10/2015 Tanaka ................ H01L 41/0973
(Continued)

FOREIGN PATENT DOCUMENTS

CN    1463453 A    12/2003
CN    101935212 A    1/2011
(Continued)

OTHER PUBLICATIONS

Lin et al "Effects of Mn doping on structural and dielectric properties of sol-gel derived (Ba0.835Ca0.165)(Zr0.09Ti0.0.91)O3 thin films", online Apr. 6, 2012, Thin Solid Films, 520, pp. 5146-5150.*

*Primary Examiner* — Matthew E Hoban
*Assistant Examiner* — Lynne Edmondson
(74) *Attorney, Agent, or Firm* — Canon U.S.A., Inc. IP Division

(57) ABSTRACT

Provided is a lead-free piezoelectric material having satisfactory and stable piezoelectric constant and mechanical quality factor in a wide practical use temperature range. The piezoelectric material includes a perovskite-type metal oxide represented by Formula (1): $(Ba_{1-x}Ca_x)_a(Ti_{1-y}Zr_y)O_3$ (wherein, $1.00 \leq a \leq 1.01$, $0.125 \leq x \leq 0.300$, and $0.041 \leq y \leq 0.074$), Mn, and Mg. The content of Mn is 0.12 parts by weight or more and 0.40 parts by weight or less based on 100 parts by weight of the perovskite-type metal oxide on a metal basis. The content of Mg is 0.10 parts by weight or less (excluding 0 part by weight) based on 100 parts by weight of the perovskite-type metal oxide on a metal basis.

23 Claims, 15 Drawing Sheets

(51) Int. Cl.
   *B41J 2/14*      (2006.01)
   *H01L 41/083*    (2006.01)
   *H02N 2/10*      (2006.01)
   *H02N 2/16*      (2006.01)
   *H04N 5/225*     (2006.01)
   *B08B 7/02*      (2006.01)
   *G02B 27/00*     (2006.01)
   *H01L 41/09*     (2006.01)

(52) U.S. Cl.
   CPC ....... *B41J 2/14274* (2013.01); *C04B 35/4682* (2013.01); *G02B 27/0006* (2013.01); *H01L 41/083* (2013.01); *H01L 41/0973* (2013.01); *H02N 2/106* (2013.01); *H02N 2/163* (2013.01); *H04N 5/2254* (2013.01); *B41J 2202/03* (2013.01); *C04B 2235/3206* (2013.01); *C04B 2235/3208* (2013.01); *C04B 2235/3236* (2013.01); *C04B 2235/3244* (2013.01); *C04B 2235/3248* (2013.01); *C04B 2235/3262* (2013.01); *C04B 2235/5445* (2013.01); *C04B 2235/72* (2013.01); *C04B 2235/77* (2013.01); *C04B 2235/78* (2013.01); *C04B 2235/786* (2013.01); *C04B 2235/79* (2013.01); *C04B 2235/80* (2013.01)

(58) Field of Classification Search
   CPC .... C04B 2235/3262; C04B 2235/3236; C04B 2235/768; C04B 2235/785; C04B 2235/786; C04B 2235/3248; C04B 2235/781; C01G 23/006; C01G 23/003; C01G 25/006; C01P 2002/34; H01L 41/187; H01L 41/1871; H02N 2/00; H02N 2/001; B41J 2/14233
   USPC ............... 252/62.9 PZ, 62.9 R; 501/134–138
   See application file for complete search history.

(56) References Cited

U.S. PATENT DOCUMENTS

| | | | |
|---|---|---|---|
| 9,190,602 B2* | 11/2015 | Kubota | ................ H01L 41/083 |
| 2003/0147194 A1* | 8/2003 | Hibi et al. | .................... 361/118 |
| 2009/0128989 A1 | 5/2009 | Suzuki | |

FOREIGN PATENT DOCUMENTS

| | | | | |
|---|---|---|---|---|
| CN | 102194670 A | 9/2011 | | |
| JP | 2009-084111 A | 4/2009 | | |
| JP | 2009215111 A | 9/2009 | | |
| JP | 2011032111 A | 2/2011 | | |
| JP | 2011-190145 A | 9/2011 | | |
| KR | 20030014712 A | 2/2003 | | |
| TW | 201038505 A1 | 11/2010 | | |
| TW | 201217301 A | 5/2012 | | |
| WO | 2012070667 A1 | 5/2012 | | |
| WO | WO 2013005701 A1 * | 1/2013 | .......... B41J 2/14233 |
| WO | WO 2013005702 A1 * | 1/2013 | .......... C04B 35/4682 |

* cited by examiner

PIEZOELECTRIC MATERIAL, PIEZOELECTRIC ELEMENT, AND ELECTRONIC APPARATUS

BACKGROUND OF THE INVENTION

Field of the Invention

The present invention relates to a piezoelectric material, in particular, a lead-free piezoelectric material. The present invention also relates to a piezoelectric element, a multilayered piezoelectric element, a liquid discharge head, a liquid discharge device, an ultrasonic motor, an optical apparatus, a vibratory device, a dust-removing device, an image pickup device, and an electronic apparatus each including the piezoelectric material.

Description of the Related Art

In general, piezoelectric materials are $ABO_3$ perovskite-type metal oxides such as lead zirconate titanate (hereinafter referred to as "PZT"). However, since PZT contains lead as an A site element, its influence on environment is controversial. Accordingly, there is a demand for a piezoelectric material of a lead-free perovskite-type metal oxide.

Barium titanate is known as a piezoelectric material of a lead-free perovskite-type metal oxide. In addition, in order to improve the characteristics of a piezoelectric material, a material of which base composition is barium titanate has been developed. Japanese Patent Laid-Open No. 2009-215111 discloses a material having improved piezoelectric properties by replacing a part of the A site of barium titanate with Ca and a part of the B site with Zr. Such a material, however, has a low Curie temperature, such as 80° C. or less, and thereby causes depolarization under a high-temperature environment, e.g., in a car in summer, to reduce the piezoelectric properties. In addition, since the mechanical quality factor is low, depolarization tends to occur when an AC voltage is applied to.

Japanese Patent Laid-Open No. 2011-032111 discloses a material in which a part of the A site of barium titanate is replaced with Ca and further to which Mn, Fe, or Cu is added. Though such a material has an excellent mechanical quality factor compared to barium titanate, the piezoelectric properties are low to require a high voltage for driving the resulting element.

SUMMARY OF THE INVENTION

The present invention provides a lead-free piezoelectric material having a satisfactory and stable piezoelectric constant and a mechanical quality factor in a wide practical use temperature range.

The present invention also provides a piezoelectric element, a multilayered piezoelectric element, a liquid discharge head, a liquid discharge device, an ultrasonic motor, an optical apparatus, a vibratory device, a dust-removing device, an image pickup device, and an electronic apparatus each including the piezoelectric material.

The piezoelectric material according to the present invention includes a perovskite-type metal oxide represented by Formula (1):

$$(Ba_{1-x}Ca_x)_a(Ti_{1-y}Zr_y)O_3 \text{ (wherein, } 1.00 \leq a \leq 1.01,$$
$$0.125 \leq x \leq 0.300, \text{ and } 0.041 \leq y \leq 0.074),$$

and Mn and Mg, wherein the content of Mn is 0.12 parts by weight or more and 0.40 parts by weight or less based on 100 parts by weight of the perovskite-type metal oxide on a metal basis; and the content of Mg is 0.10 parts by weight or less (excluding 0 part by weight) based on 100 parts by weight of the perovskite-type metal oxide on a metal basis.

The piezoelectric element according to the present invention at least includes a first electrode, a piezoelectric material, and a second electrode, wherein the piezoelectric material is the above-described piezoelectric material.

The multilayered piezoelectric element according to the present invention is constituted of alternately stacked piezoelectric material layers and electrode layers including an internal electrode, wherein the piezoelectric material layers are made of the above-described piezoelectric material.

The liquid discharge head according to the present invention at least includes a liquid chamber provided with a vibratory unit including the piezoelectric element or the multilayered piezoelectric element described above and a discharge port communicating with the liquid chamber.

The liquid discharge device according to the present invention includes a conveying unit for conveying a transfer object and the liquid discharge head described above.

The ultrasonic motor according to the present invention at least includes a vibratory component including the piezoelectric element or the multilayered piezoelectric element described above and a movable component being in contact with the vibratory component.

The optical apparatus according to the present invention includes a driving unit provided with the ultrasonic motor described above.

The vibratory device according to the present invention includes a vibratory component provided with the piezoelectric element or the multilayered piezoelectric element described above.

The dust-removing device according to the present invention includes a vibratory unit provided with the vibratory device described above in the diaphragm.

The image pickup device according to the present invention at least includes the dust-removing device described above and an image pickup element unit, wherein the diaphragm of the dust-removing device and the light-receiving surface of the image pickup element unit are disposed on the same axis, and the dust-removing device is disposed on the light-receiving surface side of the image pickup element unit.

The electronic apparatus according to the present invention includes a piezoelectric acoustic component provided with the piezoelectric element or the multilayered piezoelectric element described above.

Further features of the present invention will become apparent from the following description of exemplary embodiments with reference to the attached drawings.

DESCRIPTION OF THE EMBODIMENTS

Figure 1:
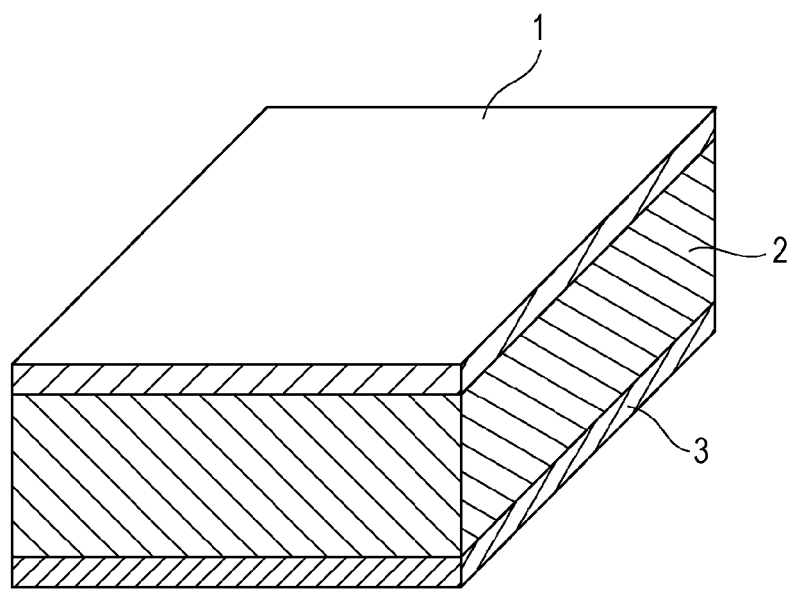
FIG. 1 is a schematic diagram illustrating an embodiment of the configuration of a piezoelectric element of the present invention.

Embodiments of the present invention will now be described.

The piezoelectric material according to the present invention includes a perovskite-type metal oxide represented by Formula (1):

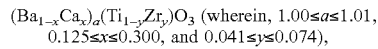

$(Ba_{1-x}Ca_x)_a(Ti_{1-y}Zr_y)O_3$ (wherein, $1.00 \leq a \leq 1.01$, $0.125 \leq x \leq 0.300$, and $0.041 \leq y \leq 0.074$), and Mn and Mg, wherein the content of Mn is 0.12 parts by weight or more and 0.40 parts by weight or less based on 100 parts by weight of the perovskite-type metal oxide on a metal basis; and the content of Mg is 0.10 parts by weight or less (excluding 0 part by weight) based on 100 parts by weight of the perovskite-type metal oxide on a metal basis.

Perovskite-Type Metal Oxide

In the present invention, the perovskite-type metal oxide refers to a metal oxide having a perovskite structure, which is ideally a cubic crystal structure, as described in Iwanami Dictionary of Physics and Chemistry, 5th Edition (Iwanami Shoten, Published on Feb. 20, 1998). The metal oxide having a perovskite structure is generally expressed by a chemical formula: $ABO_3$. In the perovskite-type metal oxide, elements A and B occupy specific unit cell positions called A-site and B-site, respectively, in the ion forms. For example, in a cubic crystal unit cell, the element A is placed at the vertexes of the cubic, and the element B is placed at the body-centered position of the cubic. The element O occupies the face-centered positions as anions of oxygen.

In the metal oxide represented by Formula (1), the metal elements positioned at the A site of the perovskite structure are Ba and Ca, and the metal elements positioned at the B site are Ti and Zr. However, a part of the Ba and Ca atoms may be positioned at the B site. Similarly, a part of the Ti and Zr atoms may be positioned at the A site.

The molar ratio of the elements on the B site of the perovskite structure to the element O in Formula (1) is basically 1:3, but the molar ratio may slightly shift (e.g., in a range of 1.00:2.94 to 1.00:3.06) as long as the perovskite structure is the primary phase of the metal oxide. Such a case is encompassed in the scope of the present invention.

The perovskite structure of the metal oxide can be confirmed by structural analysis, such as X-ray diffraction or electron beam diffraction.

The piezoelectric material according to the present invention may be in any form, such as a ceramic, powder, single crystal, film, or slurry, and, in particular, can be in a ceramic form. Throughout the specification, the term "ceramic" refers to aggregate (also referred to as bulk body) of crystal grains, of which base component is a metal oxide, hardened by firing, a so-called polycrystal. The ceramic includes those processed after sintering.

In Formula (1), "a" represents the ratio of the molar quantity of Ba and Ca at the A site to the molar quantity of Ti and Zr at the B site in the perovskite structure and is in the range of $1.00 \leq a \leq 1.01$. If the value of "a" is smaller than 1.00, grains tend to abnormally grow to reduce the mechanical strength of the material. In contrast, if the value of "a" is larger than 1.01, the temperature necessary for grain growth is too high, which makes sintering in a common firing furnace impossible. Herein, "being impossible to be sintered" indicates that a sufficient density is not obtained or that a large number of pores or defects are formed in the piezoelectric material. It is believed that the majority of Mn as an accessory component is located at the B site of the perovskite structure. Accordingly, the value of "a" should be increased with an increase of the Mn content.

In Formula (1), "x" represents the molar ratio of Ca at the A site of the perovskite structure and is in the range of $0.125 \leq x \leq 0.300$. A value of "x" smaller than 0.125 causes phase transition of the crystal structure in the driving temperature range to adversely affect the durability, whereas a value of "x" larger than 0.300 provides insufficient piezoelectric properties. The molar ratio "x" of Ca can be in the range of $0.130 \leq x \leq 0.200$.

In Formula (1), "y" represents the molar ratio of Zr at the B site and is in the range of $0.041 \leq y \leq 0.074$. A value of "y" smaller than 0.041 provides insufficient piezoelectric properties, whereas a value of "y" larger than 0.074 gives a Curie temperature (Tc) of lower than 100° C. to lose the piezoelectric properties at high temperature. The molar ratio "y" of Zr can be in the range of $0.051 \leq y \leq 0.069$.

Throughout the specification, the term "Curie temperature (Tc)" indicates the temperature at which the ferroelectricity of a material is lost. In general, the piezoelectric properties of a piezoelectric material are also lost at a temperature of the Tc or more. The Tc can be determined by directly measuring the temperature at which the ferroelectricity is lost by changing the temperature or can be determined from the temperature showing the maximum relative dielectric constant determined by measuring the relative dielectric constants with a small AC electric field by changing the temperature.

The composition of the piezoelectric material according to the present invention may be measured by any method. Examples of the method include X-ray fluorescence analysis, ICP emission spectrometric analysis, and atomic absorption spectrometry. Any of these methods can calculate the weight ratio and the composition ratio of each element contained in the piezoelectric material.

Mn Component

The content of Mn contained in the piezoelectric material of the present invention is 0.12 parts by weight or more and 0.40 parts by weight or less based on 100 parts by weight of the perovskite-type metal oxide on a metal basis. The piezoelectric material containing Mn in the above-mentioned range can have improved piezoelectric constant, insulation properties, and mechanical quality factor. Herein, the mechanical quality factor represents the elastic loss resulting from vibration when a piezoelectric material is evaluated as an oscillator. The value of the mechanical quality factor is observed as the sharpness of a resonance curve in impedance measurement. That is, the mechanical quality factor represents the sharpness of resonance of an oscillator. A high insulation property and a high mechanical quality factor ensure long-term reliability when a piezoelectric element including the piezoelectric material is driven by application of a voltage. Herein, the term "on a metal basis" showing the content of Mn represents the value determined by measuring the contents of metals, Ba, Ca, Ti, Zr, Mg, and Mn, of the piezoelectric material by, for example, X-ray fluorescence analysis (XRF), ICP emission spectrometric analysis, or atomic absorption spectrometry, converting the contents of the elements contained in the metal oxide represented by Formula (1) to those of oxides of the elements, and calculating the ratio of the weight of Mn metal to the total weight, which is assumed to be 100, of the oxides. A content of Mn less than 0.12 parts by weight reduces the mechanical quality factor to be less than 400. A low mechanical quality factor increases the electricity consumption for driving a resonance device using a piezoelectric element including the piezoelectric material. The mechanical quality factor of the piezoelectric material to be used in a resonance device should be 800 or more, such as 1000 or more. In this range, no significant increase in electricity consumption occurs in practical driving. In contrast, if the content of Mn is higher than 0.40 parts by weight, for example, a hexagonal crystal structure, which does not contribute to piezoelectric properties, appears to significantly reduce the piezoelectric properties. The content of Mn can be 0.20 parts by weight or more and 0.40 parts by weight or less based on 100 parts by weight of the metal oxide represented by Formula (1) on a metal basis.

Mn can be present only at the B site. The valence of Mn can be 4+. In general, the valence of Mn can be 4+, 2+, or 3+. When a crystal contains a conduction electron (e.g., a case of a crystal having an oxygen defect or a case of the A site occupied by a donor element), the conduction electron is trapped by decreasing the valence of Mn from 4+ to 3+ or to 2+ to enhance the insulation resistance. In addition, from the viewpoint of ionic radius, Mn having a valence of 4+ can easily replace Ti, which is the main component of the B site. In contrast, when the valence of Mn is lower than 4+, such as 2+, Mn serves as an acceptor. If Mn is present in a perovskite structure crystal as an acceptor, a hole is generated in the crystal, or oxygen vacancy is formed in the crystal.

If the majority of Mn atoms contained in the piezoelectric material have a valence of 2+ or 3+, the holes are not completely compensated by merely introducing oxygen vacancy, resulting in a reduction in insulation resistance. Accordingly, the majority of Mn atoms should have a valence of 4+. However, a significantly small amount of Mn atoms having a valence of lower than 4+ may be present as an acceptor at the B site of the perovskite structure and may form oxygen vacancy. The Mn having a valence of 2+ or 3+ and the oxygen vacancy form a defect dipole to enhance the mechanical quality factor of the piezoelectric material.

Mg Component

The content of Mg contained in the piezoelectric material of the present invention is 0.10 parts by weight or less (excluding 0 part by weight) based on 100 parts by weight of the perovskite-type metal oxide on a metal basis. The piezoelectric material containing Mg in the above-mentioned range can have improved mechanical quality factor and force factor. Herein, the force factor is represented by the product of ($|d_{31} \times Y_{11}|$) of a piezoelectric constant ($d_{31}$) and a Young's modulus ($Y_{11}$) and denotes the force generating piezoelectric strain.

Herein, the term "on a metal basis" showing the content of Mg represents the value determined by measuring the contents of metals, Ba, Ca, Ti, Zr, Mn, and Mg, of the piezoelectric material by, for example, X-ray fluorescence analysis (XRF), ICP emission spectrometric analysis, or atomic absorption spectrometry, converting the contents of the elements contained in the metal oxide represented by Formula (1) to those of oxides of the elements, and calculating the ratio of the weight of Mg metal to the total weight, which is assumed to be 100, of the oxides.

A content of Mg exceeding 0.10 parts by weight reduces the mechanical quality factor to be less than 800 and also reduces the force factor to be less than 10 (N/V·m). A low mechanical quality factor increases the electricity consumption for driving a resonance device using a piezoelectric element including the piezoelectric material. The mechanical quality factor should be 800 or more, such as 1000 or more.

The force factor of the piezoelectric material should be 10 (N/V·m) or more. A force factor of less than 10 reduces the force generating piezoelectric strain, increases the electric field necessary for driving a piezoelectric element, and increases the electricity consumption. Within the above-mentioned ranges of the mechanical quality factor and the force factor, no significant increase in electricity consumption occurs in practical driving of the piezoelectric element.

From the viewpoint of obtaining satisfactory mechanical quality factor and force factor, the content of Mg should by 0.05 parts by weight or less, such as 0.0005 parts by weight or more and 0.015 parts by weight or less.

The form of Mg contained in the piezoelectric material is not limited to a metal form as long as an Mg component is contained in the piezoelectric material. For example, Mg may be solid-soluted in the A site or the B site of the perovskite structure or may be contained in the grain boundaries. The Mg component may be contained in the piezoelectric material in a form such as a metal, an ion, an oxide, a metal salt, or a complex.

Accessory Component

The piezoelectric material according to the present invention may contain metal elements, in addition to the perovskite-type metal oxide represented by Formula (1) and Mn and Mg, as an accessory component in a range that does not change the properties of the material. The total amount of the metal elements as the accessory component can be 1.2 parts by weight or less based on 100 parts by weight of the metal oxide represented by Formula (1) on a metal basis. A content of the accessory component exceeding 1.2 parts by weight may decrease the piezoelectric properties and the insulation properties of the piezoelectric material.

In addition, the content of metal elements, other than Ba, Ca, Ti, Zr, Mn, and Mg, as the accessory component can be 1.0 part by weight or less on an oxide basis or 0.9 parts by weight or less on a metal basis relative to the piezoelectric material.

Throughout the specification, the term "metal element as the accessory component" includes semimetal elements such as Si, Ge, and Sb. If the content of the metal elements, other than Ba, Ca, Ti, Zr, Mn, and Mg, as the accessory component exceeds 1.0 part by weight on an oxide basis or 0.9 parts by weight on a metal basis relative to the piezoelectric material, the piezoelectric properties and the insulation properties of the piezoelectric material may significantly decrease.

The total content of Li, Na, Al, Zn, and K elements of the accessory component can be 0.5 parts by weight or less on a metal basis relative to the piezoelectric material.

A total content of Li, Na, Al, Zn, and K elements in the accessory component exceeding 0.5 parts by weight on a metal basis relative to the piezoelectric material may make the sintering insufficient. The total content of Y and V elements of the accessory component should be 0.2 parts by weight or less on a metal basis relative to the piezoelectric material. A total content of Y and V elements exceeding 0.2 parts by weight on a metal basis with respect to the piezoelectric material may make the polarization treatment difficult.

Examples of the accessory component include sintering aids such as Si and Cu. In addition, the piezoelectric material of the present invention may contain Sr in an amount comparable to that contained in commercially available raw materials of Ba and Ca as an inevitable component. Similarly, the piezoelectric material of the present invention may contain Nb in an amount comparable to that contained in a commercially available Ti raw material as an inevitable component and Hf in an amount comparable to that contained in a commercially available Zr raw material as an inevitable component. The amount of the accessory component may be measured by any method. Examples of the method include X-ray fluorescence analysis, ICP emission spectrometric analysis, or atomic absorption spectrometry.

Structural Phase Transition Point

The piezoelectric material of the present invention should not have the structural phase transition point within a range of −25° C. to 100° C. Barium titanate is generally known that the temperature (hereinafter referred to as $T_{o \to t}$) at which the crystal structure is changed from the orthorhombic crystal phase to the tetragonal crystal phase is approximately 17° C. and that the temperature ($T_{t \to o}$) at which the crystal structure is changed from the tetragonal crystal phase to the orthorhombic crystal phase is approximately 5° C. These transition temperatures of the crystal structure are referred to as structural phase transition points. If the temperature of the piezoelectric material is repeatedly varied between these structural phase transition points due to environmental temperature changes, the volume and the polarization axis direction of the unit cell are repeatedly changed. This may gradually cause depolarization to deteriorate the piezoelectric properties. Due to this phenomenon, it has been difficult to use barium titanate in a broad temperature range.

However, the piezoelectric material of the present invention has a $T_{o \to t}$ of lower than −25° C. and therefore does not have the above-described problem. In addition, since the Curie temperature (Tc) at which a tetragonal crystal phase is changed to a cubic crystal phase is higher than 100° C., the piezoelectric properties can be maintained even under severe circumstances of 80° C., which is assumed in a car in summer. Furthermore, since the piezoelectric material maintains its tetragonal crystal structure in a temperature range of −25° C. to 100° C., a high mechanical quality factor can be maintained. In addition, it is possible to avoid the use of the orthorhombic crystal region having a relatively low mechanical quality. Consequently, the piezoelectric material can have satisfactory and stable piezoelectric constant and mechanical quality factor in a wide practical use temperature range.

Grain Diameter

In the piezoelectric material according to the present invention, the crystal grains constituting the piezoelectric material can have an average equivalent circular diameter of 1 µm or more and 10 µm or less. When the average equivalent circular diameter is in this range, the piezoelectric material of the present invention can have satisfactory piezoelectric properties and mechanical strength. An average equivalent circular diameter of less than 1 µm may make the piezoelectric properties insufficient, whereas an average equivalent circular diameter of larger than 10 µm may decrease the mechanical strength of the piezoelectric material. The average equivalent circular diameter can be in a range of 3 µm or more and 8 µm or less.

Throughout the specification, the term "equivalent circular diameter" represents "projected area equivalent circular diameter" usually used in microscopic observation and represents the diameter of a perfect circle having the same area as that of the projected area of a crystal grain. In the present invention, the equivalent circular diameter may be measured by any method. For example, the equivalent circular diameter can be determined by image processing of an image of the piezoelectric material surface photographed with a polarizing microscope or a scanning electron microscope. Since the optimum magnification varies depending on the grain diameter of an object, an optical microscope or an electron microscope may be used properly depending on the diameter. The equivalent circular diameter may be determined from an image of a polished surface or a cross section instead of the surface of a material.

Density

The piezoelectric material of the present invention can have a relative density of 93% or more and 100% or less. A relative density of less than 93% may provide insufficient piezoelectric properties and mechanical quality factor or may reduce the mechanical strength. The term "relative density" indicates the ratio of the measured density to the theoretical density calculated from the lattice constant of the piezoelectric material and the atomic weight of the constituent elements of the piezoelectric material. The lattice constant can be determined by, for example, X-ray diffraction analysis. The density can be measured by, for example, an Archimedes's method.

A method of producing the piezoelectric material according to the present invention will now be described.

Raw Material

The piezoelectric material according to the present invention may be produced by any method. The piezoelectric material can be produced by a common process of sintering a solid powder of, for example, oxides, carbonates, nitrates, or oxalates containing constituent elements under an ordinary pressure. The raw material is constituted of metal compounds such as a Ba compound, a Ca compound, a Ti compound, a Zr compound, a Mn compound, and a Mg compound.

Usable examples of the Ba compound include barium oxide, barium carbonate, barium oxalate, barium acetate, barium nitrate, barium titanate, barium zirconate, and barium zirconate titanate. These Ba compounds can be commercially available high-purity compounds (e.g., a purity of 99.99% or more). A Ba compound having a low purity contains a large amount of Mg, which may cause impossibility of production of the piezoelectric material of the present invention.

Usable examples of the Ca compound include calcium oxide, calcium carbonate, calcium oxalate, calcium acetate, calcium titanate, and calcium zirconate. These Ca compounds can be commercially available high-purity compounds (e.g., a purity of 99.99% or more). A Ca compound having a low purity contains a large amount of Mg, which may cause impossibility of production of the piezoelectric material of the present invention.

Usable examples of the Ti compound include titanium oxide, barium titanate, barium zirconate titanate, and calcium titanate.

Usable examples of the Zr compound include zirconium oxide, barium zirconate, barium zirconate titanate, and calcium zirconate.

Usable examples of the Mn compound include manganese carbonate, manganese oxide, manganese dioxide, manganese acetate, and trimanganese tetraoxide.

Usable examples of the Mg compound include magnesium carbonate, magnesium oxide, magnesium hydroxide, magnesium peroxide, and magnesium chloride.

In the piezoelectric material according to an embodiment of the present invention, the "a" showing the ratio of the molar quantity of Ba and Ca at the A site to the molar quantity of Ti and Zr at the B site may be adjusted with any raw material. The same effect can be obtained by adjusting the "a" with any of Ba compounds, Ca compounds, Ti compounds, and Zr compounds.

Granulation

The raw material powder of the piezoelectric material may be granulated by any method. From the viewpoint of giving a granulated powder having a uniform particle diameter, spray-dry can be employed. Usable examples of the binder that is used in granulation include polyvinyl alcohol (PVA), polyvinyl butylal (PVB), and acrylic resins. The binder is used in an amount of 1 to 10 parts by weight, in particular, 2 to 5 parts by weight from the viewpoint of giving a compact having a higher density.

Sintering

The piezoelectric material according to an embodiment of the present invention may be sintered by any method. Examples of the sintering include sintering in an electric furnace, sintering in a gas furnace, electrical heating, microwave sintering, millimeter-wave sintering, and hot isostatic pressing (HIP). The electric furnace and the gas furnace may be continuous furnaces or batch furnaces. The sintering of the piezoelectric material may be performed at any temperature and can be performed at a temperature allowing each compound to react and crystals to sufficiently grow. From the viewpoint of giving grains of the piezoelectric material having a grain diameter in the range of 1 to 10 μm, the sintering temperature can be 1200° C. or more and 1550° C. or less, such as 1300° C. or more and 1480° C. or less.

The piezoelectric material sintered in such a temperature range shows satisfactory piezoelectric performance. In order to stably reproduce the properties of a piezoelectric material prepared by sintering, the sintering is performed at a constant temperature within the above-mentioned range for 2 to 48 hours. Though sintering such as two-stage sintering may be employed, a rapid change in temperature should be avoided in light of productivity. The piezoelectric material after polishing processing may be heat-treated at a temperature of 1000° C. or more. Mechanical polishing generates a residual stress inside the piezoelectric material. The heat treatment at 1000° C. or more relieves the residual stress to further enhance the piezoelectric properties of the piezoelectric material. The heat treatment also has an effect of eliminating the raw material powder, such as barium carbonate, precipitated at the grain boundaries. The heat treatment may be performed for any period of time, such as 1 hour or more.

Piezoelectric Element

The piezoelectric element of the present invention will now be described.

FIG. 1 is a schematic diagram illustrating an embodiment of the configuration of a piezoelectric element of the present invention. The piezoelectric element according to the present invention at least includes a first electrode 1, a piezoelectric material unit 2, and a second electrode 3. The piezoelectric material unit 2 is the piezoelectric material of the present invention.

The piezoelectric properties of the piezoelectric material according to the present invention can be evaluated by being produced into a piezoelectric element at least having a first electrode and a second electrode. The first and the second electrodes are each a conductive layer having a thickness of about 5 nm to 10 μm. The electrodes may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, sputtering, or vapor deposition. The first and the second electrodes may be each patterned into a desired shape.

Polarization

In the piezoelectric element, the polarization axes may be unidirectionally aligned. The unidirectionally aligned polarization axes increase the piezoelectric constant of the piezoelectric element.

The piezoelectric element may be polarized by any method. The polarization treatment may be performed in the atmosphere or in a silicone oil. The polarization may be performed at a temperature of 60° C. to 150° C. The optimum conditions for the polarization slightly vary depending on the composition of the piezoelectric material constituting the element. The electric field applied in the polarization treatment may be from 800 V/mm to 2.0 kV/mm.

Resonance-Antiresonance Method

The piezoelectric constant and the mechanical quality factor of the piezoelectric element can be determined by calculation based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

Multilayered Piezoelectric Element

The multilayered piezoelectric element of the present invention will now be described.

The multilayered piezoelectric element according to the present invention at least includes a laminate composed of alternately stacked piezoelectric material layers and internal electrodes, a first electrode, and a second electrode. The piezoelectric material layers are made of the piezoelectric material.

Figure 2A:
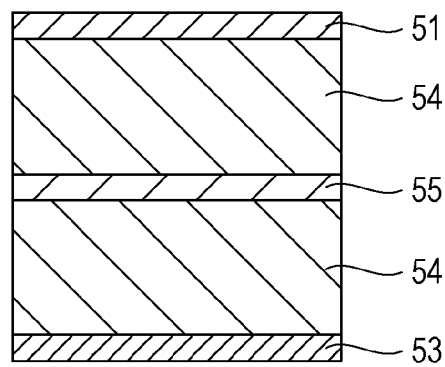
FIGS. 2A and 2B are schematic cross-sectional diagrams illustrating an embodiment of the configuration of a multilayered piezoelectric element of the present invention.
Figure 2B:
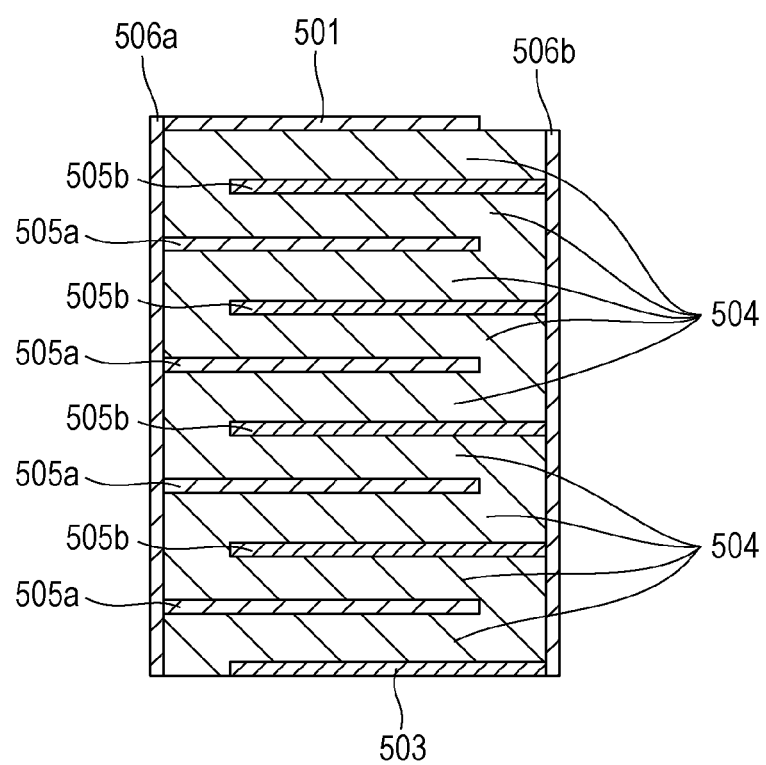

FIGS. 2A and 2B are schematic cross-sectional diagrams illustrating an embodiment of the configuration of a multilayered piezoelectric element of the present invention. The multilayered piezoelectric element according to the present invention is constituted of an electrode layer including material layers 54 and internal electrodes 55. Thus, these are alternately stacked, and the piezoelectric material layers 54 are made of the piezoelectric material of the present invention. The electrode layer may include external electrodes such as a first electrode 51 and a second electrode 53, in addition to the internal electrode 55.

FIG. 2A shows a configuration of a multilayered piezoelectric element of the present invention, where a laminate composed of two piezoelectric material layers 54 and one internal electrode 55 are alternately stacked is disposed between the first electrode 51 and the second electrode 53. The numbers of the piezoelectric material layers and the internal electrodes are not limited. As shown in FIG. 2B, the multilayered piezoelectric element of the present invention may increase the numbers of the piezoelectric material layers and the internal electrodes. In the multilayered piezoelectric element shown in FIG. 2B, a laminate composed of alternately stacked nine piezoelectric material layers 504 and eight internal electrodes 505 (505a or 505b) is disposed between the first electrode 501 and the second electrode 503. The multilayered piezoelectric element includes an external electrode 506a and an external electrode 506b for short-circuiting the alternately disposed internal electrodes.

The sizes and the shapes of the internal electrodes 55, 505 and the external electrodes 506a, 506b are not necessarily the same as those of the piezoelectric material layers 54, 504 and may be divided into two or more pieces.

The internal electrodes 55, 505, the external electrodes 506a, 506b, the first electrodes 51, 501, and the second electrodes 53, 503 are each a conductive layer having a thickness of about 5 nm to 10 μm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrodes 55, 505 and the external electrodes 506a, 506b may be each made of any one of these materials or a mixture or alloy of two or more of these materials or may be each a multilayer made of two or more of these materials. Two or more of these electrodes may be made of different materials. The internal electrodes 55, 505 contain Ag and Pd, and the weight ratio M1/M2 of the content M1 of the Ag to the content M2 of the Pd should be $0.25 \leq M1/M2 \leq 4.0$, preferably, $0.3 \leq M1/M2 \leq 3.0$. A weight ratio M1/M2 of less than 0.25 disadvantageously increases the sintering temperature of the internal electrodes, whereas a weight ratio M1/M2 of higher than 4.0 disadvantageously makes the internal electrodes island-like to cause in-plane unevenness. From the viewpoint of being inexpensive electrode materials, the internal electrodes 55, 505 should contain at least one of Ni and Cu. When the internal electrodes 55, 505 contain at least one of Ni and Cu, the multilayered piezoelectric element of the present invention should be fired in a reducing atmosphere.

As shown in FIG. 2B, a plurality of electrodes including the internal electrodes 505 may be short-circuited to each other for adjusting the phase of the driving voltage. For example, the internal electrodes 505a and the first electrode 501 may be short-circuited with the external electrode 506a. The internal electrodes 505b and the second electrode 503 may be short-circuited with the external electrode 506b. The internal electrodes 505a and the internal electrodes 505b may be alternately disposed. The form of short-circuit between electrodes is not particularly limited. An electrode or wiring for short-circuit may be disposed on the side surface of the multilayered piezoelectric element. Alternatively, electrodes may be short-circuited with a conductive material disposed inside a through-hole formed so as to pass through the piezoelectric material layers 504.

The multilayered piezoelectric element according to the present invention may be produced by any method. An example of the method of producing the multilayered piezoelectric element will now be described. The method includes a step (A) of preparing a slurry by dispersing a metal compound powder at least containing Ba, Ca, Ti, Zr, Mn, and Mg; a step (B) of preparing a green compact by disposing the slurry on a base material; a step (C) of forming an electrode on the green compact; and a step (D) of forming a multilayered piezoelectric element by sintering the green compact provided with the electrode.

Throughout the specification, the term "powder" is intended to mean an assembly of solid grains and may be an assembly of grains containing Ba, Ca, Ti, Zr, Mn, and Mg or may be an assembly of different types of grains containing arbitrary elements.

Step (A)

Examples of the metal compound powder in the step (A) include Ba compounds, Ca compounds, Ti compounds, Zr compounds, Mn compounds, and Mg compounds.

An exemplary method of producing a slurry in the step (A) will be described. The metal compound powder is mixed with a solvent in an amount of 1.6 to 1.7 times the weight of the powder. The solvent can be, for example, toluene, ethanol, a solvent mixture of toluene and ethanol, n-butyl acetate, or water. The mixture is mixed with a ball mill for 24 hours, followed by addition of a binder and a plasticizer thereto. Examples of the binder include polyvinyl alcohol (PVA), polyvinyl butylal (PVB), and acrylic resins. In a case of using PVB as the binder, the PVB is weighed such that the weight ratio of the solvent (S) to the PVB is, for example, 88:12 (S:PVB). Examples of the plasticizer include dioctyl sebacate (DOS), dioctyl phthalate (DOP), and dibutyl phthalate (DBP). In a case of using dibutyl phthalate as the plasticizer, the plasticizer is weighed in an amount that is the same as that of the binder. The mixture is mixed again with a ball mill overnight, and the amounts of the solvent and the binder are controlled such that the slurry has a viscosity of 300 to 500 mPa·s.

Step (B)

The green compact in the step (B) is a mixture of the metal compound powder, the binder, and the plasticizer in a sheet form. The green compact in the step (B) can be prepared by, for example, sheet molding. The sheet molding can be performed by, for example, a doctor blade method. In the doctor blade method, a sheet form compact is formed by applying the slurry onto a base material with a doctor blade and drying the slurry.

As the base material, for example, a PET film can be used. The green compact can be readily detached from the PET film by coating the surface, to which the slurry is applied, of the PET film with fluorine. The drying may be natural drying or hot air drying. The compact may have any thickness and can be controlled depending on the thickness of the multilayered piezoelectric element. The thickness of the compact can be increased by, for example, increasing the viscosity of the slurry.

Step (C)

In the step (C), the electrodes, i.e., the internal electrodes 505 and the external electrodes 506a, 506b, may be produced by any method and may be formed by, for example, baking of a metal paste or by sputtering, vapor deposition, or printing. In order to reduce the driving voltage, the thickness and the pitch distance of the piezoelectric material layers 504 may be reduced. In such a case, a laminate including the precursor of the piezoelectric material layers 504 and the internal electrodes 505a, 505b is formed, and then the laminate is fired for simultaneously firing the piezoelectric material layers and the internal electrodes. In such a case, the material for the internal electrodes is required not to cause a change in shape and a decrease in conductivity at the temperature necessary for sintering the piezoelectric material layers 504.

A metal such as Ag, Pd, Au, Cu, or Ni, which has a lower melting point and is less expensive compared to Pt, or an alloy thereof can be used for the internal electrodes 505a, 505b and external electrodes 506a, 506b. The external electrodes 506a, 506b may be provided after firing of the laminate. In such a case, in addition to Ag, Pd, Cu, and Ni, Al or a carbon-based electrode material can be used.

The electrodes can be formed by screen printing. In the screen printing, a screen printing plate is placed on a green compact disposed on a base material, and a metal paste is applied onto the green compact through the screen printing plate with a spatula. The screen printing plate is at least partially provided with a screen mesh. Consequently, the metal paste on the screen mesh portion is applied onto the green compact. If the screen mesh of the screen printing plate is provided with a pattern, an electrode can be patterned on the green compact with the metal paste having the pattern transferred through the screen mesh.

After formation of the electrodes in the step (C), the compact is detached from the base material. The compact or a plurality of the compacts stacked is pressure bonded. Examples of the pressure bonding include uniaxial pressing, cold hydrostatic pressing, and hot hydrostatic pressing. The hot hydrostatic pressing can apply an isotropically uniform pressure. An increase of the temperature to around the glass transition temperature of the binder during the press bonding can achieve better bonding. A desired thickness can be obtained by stacking a plurality of green compacts and press bonding them. For example, the green compacts can be laminated through thermocompression bonding by stacking 10 to 100 green compacts and applying a pressure of 10 to 60 MPa in the laminating direction at 50° C. to 80° C. for 10 seconds to 10 minutes. A plurality of green compacts can be precisely laminated by placing alignment marks to the electrodes and adjusting alignment of the green compacts with the marks. The green compacts can also be precisely laminated by providing through-holes for positioning to the compacts.

Step (D)

In the step (D), the sintering of the compact may be performed at any temperature and can be performed at a temperature allowing each compound to react and crystals to sufficiently grow. For example, the sintering temperature is 1200° C. or more and 1550° C. or less, such as 1300° C. or more and 1480° C. or less, from the viewpoint of controlling the ceramic grain diameter within a range of 1 to 10 μm. The multilayered piezoelectric element sintered in such a temperature range shows satisfactory piezoelectric performance.

When a material mainly composed of Ni is used as the electrode in the step (C), the step (D) should be performed in a furnace that allows atmospheric firing. The compact is burned at a temperature of 200° C. to 600° C. in an air atmosphere to remove the binder and is then sintered at a temperature of 1200° C. to 1550° C. in a reducing atmosphere. Herein, the reducing atmosphere is an atmosphere of a gas mixture mainly composed of hydrogen ($H_2$) and nitrogen ($N_2$). The volume fraction of hydrogen and nitrogen ($H_2:N_2$) can be in a range of 1:99 to 10:90. The gas mixture may contain oxygen. The oxygen concentration is $10^{-12}$ Pa or more and $10^{-4}$ Pa or less, such as $10^{-8}$ Pa or more and $10^{-5}$ Pa or less. The oxygen concentration can be measured with a zirconia type oxygen analyzer. The use of a Ni electrode allows the multilayered piezoelectric element of the present invention to be inexpensively produced. After the firing in the reducing atmosphere, for example, the temperature is decreased to 600° C., and oxidation should be performed in an air atmosphere (oxidizing atmosphere). Then, the sintered compact is taken out from the firing furnace, and a conductive paste is applied onto the side face of the element assembly to which the end of the internal electrode is exposed, followed by drying to form an external electrode.

Liquid Discharge Head

The liquid discharge head of the present invention will now be described.

The liquid discharge head according to the present invention at least includes a liquid chamber having a vibratory unit including the piezoelectric element or the multilayered piezoelectric element and a discharge port communicating with the liquid chamber.

Figure 3A:
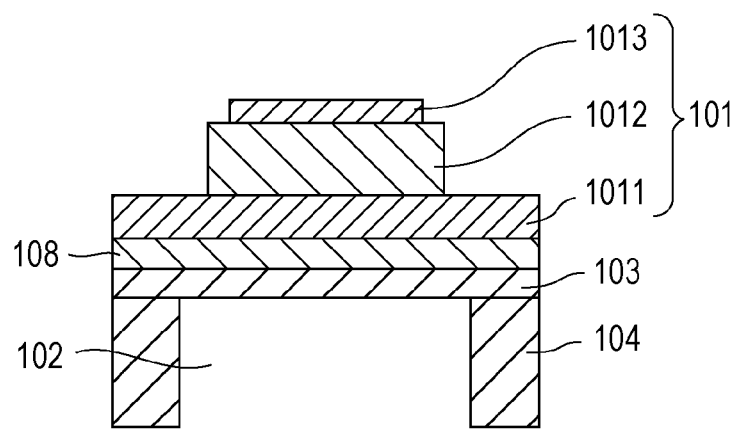
FIGS. 3A and 3B are schematic diagrams illustrating an embodiment of the configuration of a liquid discharge head of the present invention.
Figure 3B:
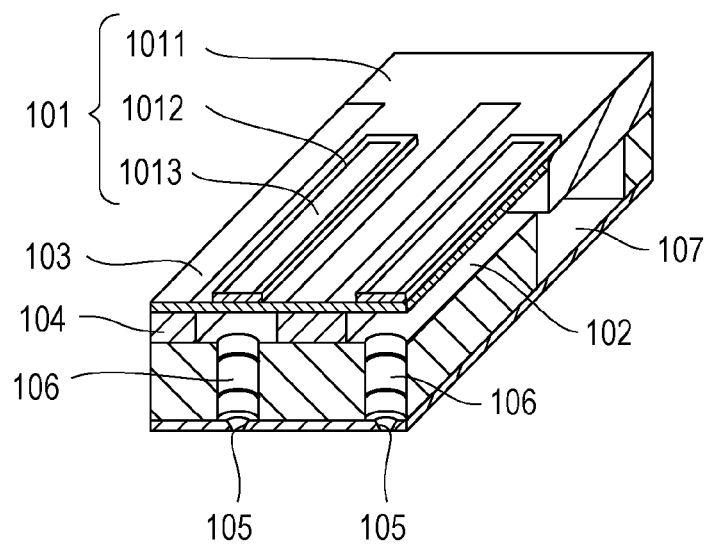

FIGS. 3A and 3B are schematic diagrams illustrating an embodiment of the configuration of a liquid discharge head of the present invention. As shown in FIGS. 3A and 3B, the liquid discharge head of the present invention includes a piezoelectric element 101 of the present invention. The piezoelectric element 101 at least includes a first electrode 1011, a piezoelectric material 1012, and a second electrode 1013. The piezoelectric material 1012 is optionally patterned as shown in FIG. 3B.

FIG. 3B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric elements 101 shown in the drawing each have a rectangular shape, but have any shape such as an elliptical, circular, or parallelogram shape. In general, the piezoelectric material 1012 has a shape along the shape of the individual liquid chamber 102.

The vicinity of the piezoelectric element 101 in the liquid discharge head of the present invention will be described in detail with reference to FIG. 3A. FIG. 3A is a cross-sectional view of the piezoelectric element shown in FIG. 3B in the width direction. The cross section of the piezoelectric element 101 is rectangular, but may be trapezoidal or reverse trapezoidal.

In the drawing, the first electrode 1011 is used as a lower electrode, and the second electrode 1013 is used as an upper electrode. The arrangement of the first electrode 1011 and the second electrode 1013 is not limited to this. For example, the first electrode 1011 may be used as a lower electrode or an upper electrode. Likewise, the second electrode 1013 may be used as an upper electrode or a lower electrode. In addition, a buffer layer 108 may be disposed between the diaphragm 103 and the lower electrode. These differences in name are due to the difference in method of producing the devices, and all of them can provide the effects of the present invention.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head of the present invention can be used in printers or can be applied to production of electronic devices.

The diaphragm 103 can have a thickness of 1.0 μm or more and 15 μm or less, such as 1.5 μm or more and 8 μm or less. The diaphragm may be made of any material. For example, the diaphragm may be made of Si, and Si of the diaphragm may be doped with boron or phosphorus. In addition, the buffer layer or the electrode layer on the diaphragm may be a part of the diaphragm. The buffer layer 108 may have a thickness of 5 nm or more and 300 nm or less, such as 10 nm or more and 200 nm or less. The discharge port 105 has a size of 5 μm or more and 40 μm or less as the equivalent circular diameter. The shape of the discharge port 105 may be circular or a star, square, or triangle shape.

Liquid Discharge Device

The liquid discharge device of the present invention will now be described. The liquid discharge device of the present invention includes a holding unit for the transfer object and the liquid discharge head.

Figure 4:
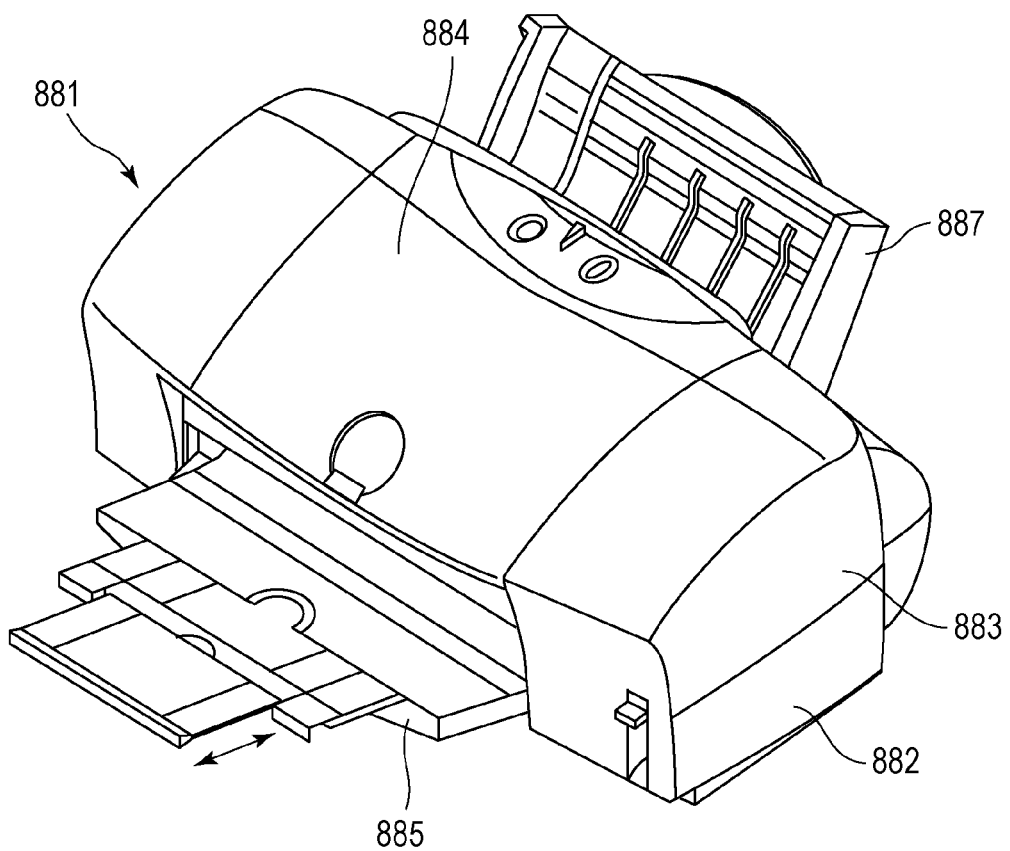
FIG. 4 is a schematic diagram illustrating an embodiment of a liquid discharge device of the present invention.
Figure 5:
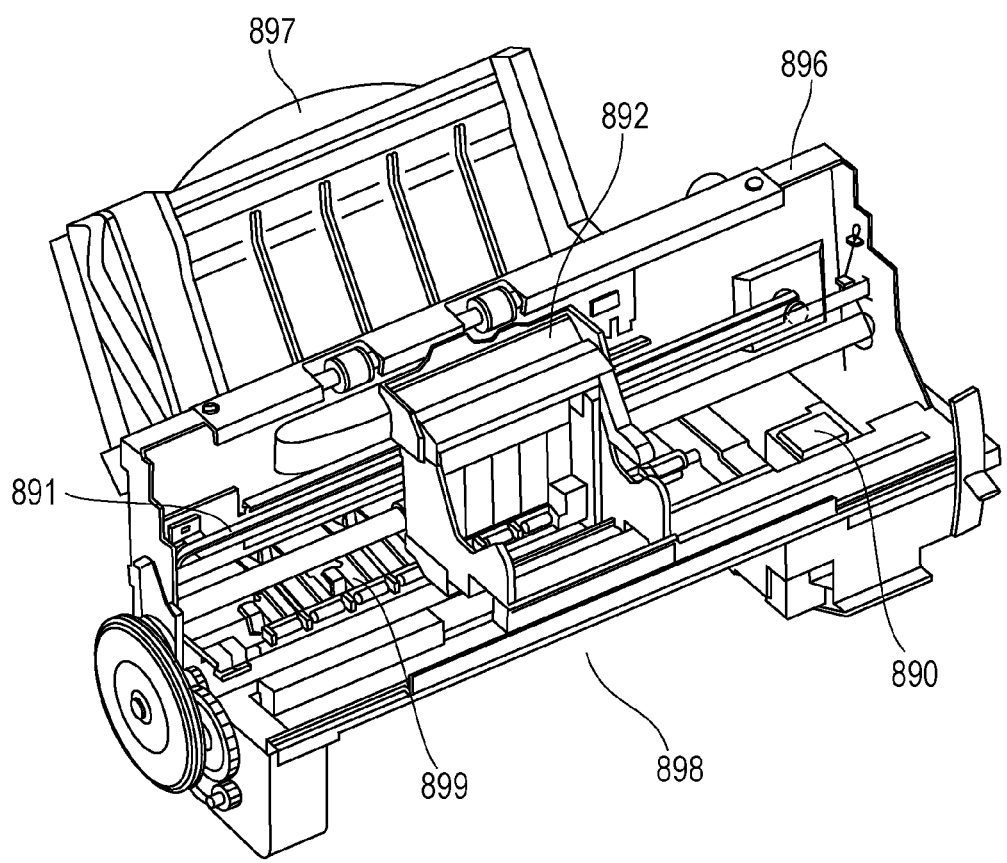
FIG. 5 is a schematic diagram illustrating an embodiment of a liquid discharge device of the present invention.

The ink-jet recording apparatus shown in FIGS. 4 and 5 is an example of the liquid discharge device of the present invention. FIG. 5 shows the liquid discharge device (ink-jet recording apparatus) 881 shown in FIG. 4 in a state where the exteriors 882 to 885 and 887 are removed. The ink-jet recording apparatus 881 includes an automatic feeder 897 for automatically feeding recoding paper as a transfer object to the device main body 896. Furthermore, the ink-jet recording apparatus 881 includes a conveying unit 899, which is the holding unit for the transfer object, for conveying the recording paper fed from the automatic feeder 897 to a predetermined recording position and then conveying the recording paper from the recording position to the ejection port 898; a recording portion 891 for performing recording onto the recording paper conveyed to the recording position; and a recovering portion 890 for performing recovering treatment to the recording portion 891. The recording portion 891 is provided with a carriage 892 that receives the liquid discharge head of the present invention and moves on a rail in a reciprocating motion.

In such an ink-jet recording apparatus, the carriage 892 slides on the rail according to the electric signals sent from a computer, and the piezoelectric material is displaced by application of a driving voltage to the electrodes between which the piezoelectric material is disposed. The displacement of the piezoelectric material applies a pressure to the individual liquid chamber 102 via the diaphragm 103 shown in FIG. 3B, and thereby an ink is discharged from the discharge port 105 to perform printing.

In the liquid discharge device of the present invention, it is possible to uniformly discharge a liquid at high speed and to reduce the size of the device.

The above-described example of the liquid discharge device is a printer, but the liquid discharge device of the present invention can be used as not only ink-jet recording apparatuses, such as a facsimile machine, a multifunction machine, or a copier, but also as a liquid discharge device in industrial use. In addition, a user can select a desired transfer object according to the purpose. Incidentally, a structure in which a liquid discharge head moves relative to the transfer object placed on a stage as the holding unit may be employed.

Ultrasonic Motor

The ultrasonic motor of the present invention will now be described. The ultrasonic motor according to the present invention at least includes a vibratory component including the piezoelectric element or the multilayered piezoelectric element and a movable component being in contact with the vibratory component.

Figure 6A:
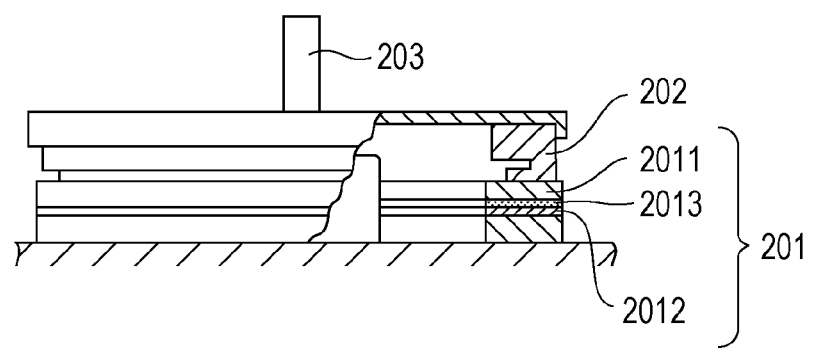
FIGS. 6A and 6B are schematic diagrams illustrating an embodiment of the configuration of an ultrasonic motor of the present invention.
Figure 6B:
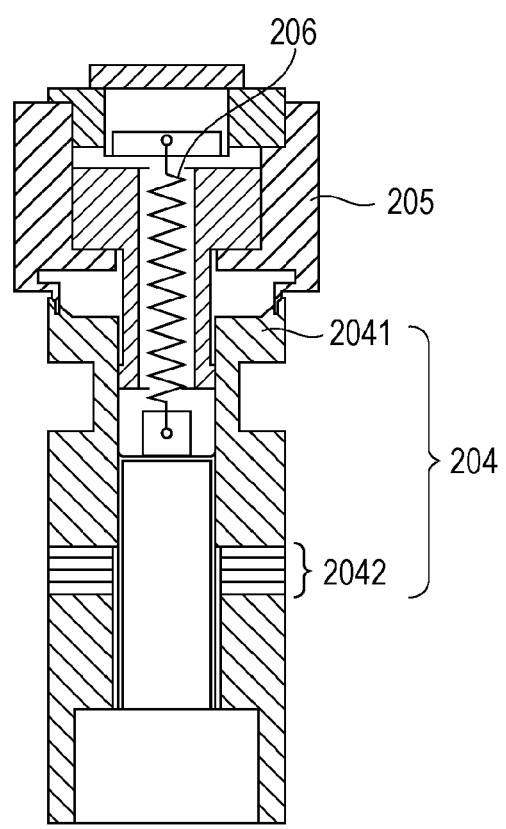

FIGS. 6A and 6B are schematic diagrams illustrating an embodiment of the configuration of an ultrasonic motor of the present invention. FIG. 6A shows an ultrasonic motor of which piezoelectric element of the present invention is a single plate. The ultrasonic motor includes an oscillator 201, a rotor 202 being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 of the present invention, and an organic adhesive (e.g., epoxy or cyanoacrylate adhesive) 2013 for bonding the piezoelectric element 2012 to the elastic ring 2011. The piezoelectric element 2012 of the present invention is constituted of a first electrode, a second electrode (both are not shown), and the piezoelectric material disposed therebetween.

When two alternating voltages different in phase by odd number times $\pi/2$ are applied to the piezoelectric element of the present invention, flexural traveling waves are generated in the oscillator 201, and each point on the sliding surface of the oscillator 201 moves in an elliptic motion. The rotor 202 pressed to the sliding surface of the oscillator 201 receives a frictional force from the oscillator 201 to rotate in the direction opposite to the flexural traveling waves. The object (not shown) to be driven is connected to the output shaft 203 and is driven by the turning force of the rotor 202.

A piezoelectric material to which a voltage is applied expands and contracts by the transverse piezoelectric effect. When an elastic material such as a metal is in contact with the piezoelectric element, the elastic material is bent by the expansion and contraction of the piezoelectric material. The ultrasonic motor described here utilizes this principle.

FIG. 6B shows an example of an ultrasonic motor including a piezoelectric element having a laminate structure. The oscillator 204 is composed of a tubular metal elastic bodies 2041 and a multilayered piezoelectric element 2042 disposed between the elastic bodies. The multilayered piezoelectric element 2042 is constituted of a plurality of stacked piezoelectric materials (not shown) and includes first and second electrodes on the outer surfaces of the stacked piezoelectric materials and internal electrodes between the stacked piezoelectric materials. The metal elastic bodies 2041 are connected to each other with a bolt to fix the multilayered piezoelectric element 2042 therebetween to form the oscillator 204.

When alternating voltages different in phase are applied to the multilayered piezoelectric element 2042, the oscillator 204 generates two vibrations rectangular to each other. The two vibrations are combined to create a circular vibration for driving the end portion of the oscillator 204. The oscillator 204 is provided with a constricted circumferential groove at the upper portion to enlarge the vibration for driving.

The rotor 205 is in pressurized contact with the oscillator 204 by means of the pressurizing spring 206 to create a frictional force for driving. The rotor 205 is rotatably supported by bearing.

Optical Apparatus

The optical apparatus of the present invention will now be described. The optical apparatus of the present invention includes the ultrasonic motor in the driving unit.

Figure 7A:
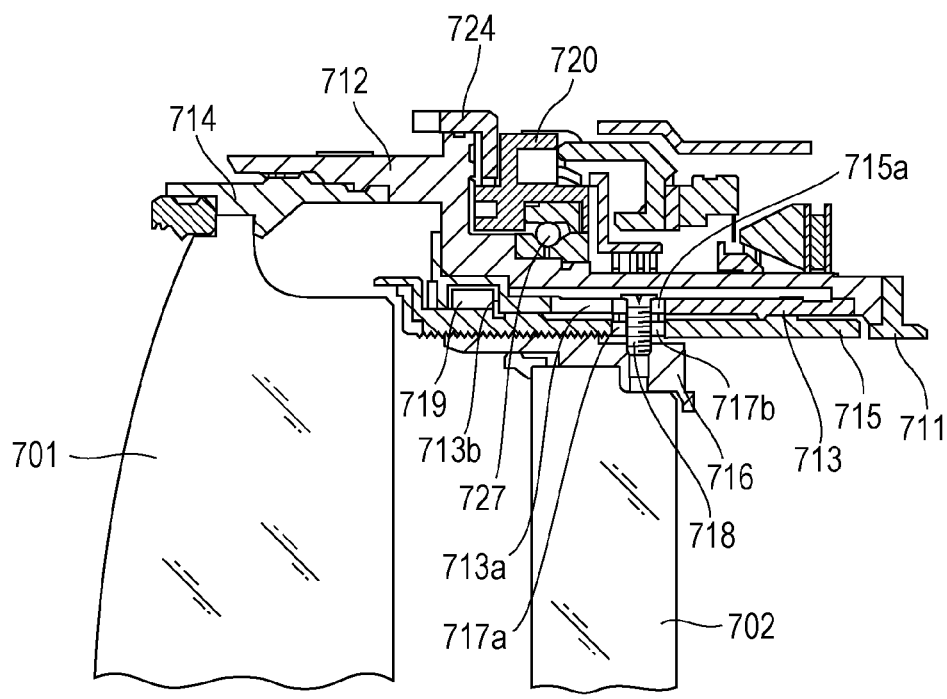
FIGS. 7A and 7B are schematic diagrams illustrating an embodiment of an optical apparatus of the present invention.
Figure 7B:
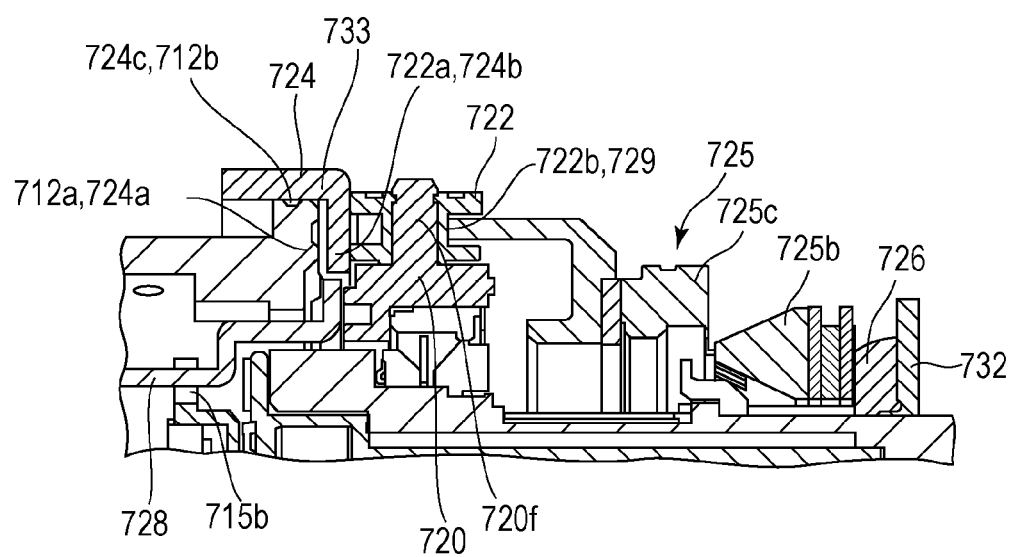
Figure 8:
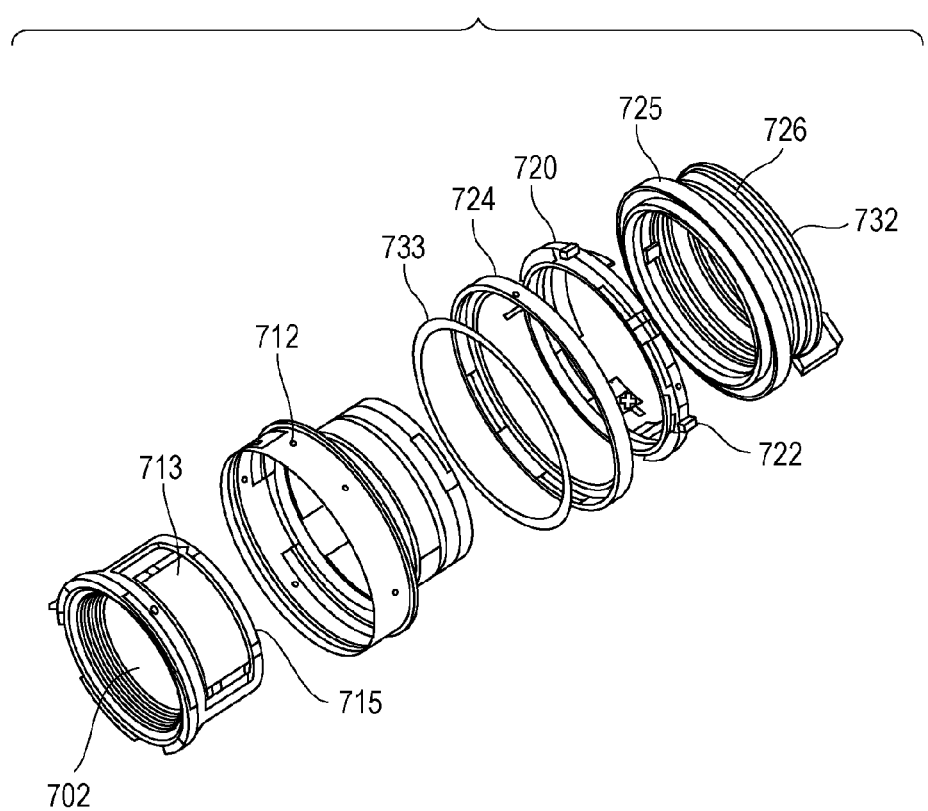
FIG. 8 is a schematic diagram illustrating an embodiment of an optical apparatus of the present invention.

FIGS. 7A and 7B are main cross-sectional views of an interchangeable lens barrel of a single lens reflex camera as an embodiment of the image pickup device of the present invention. FIG. 8 is an exploded perspective view of an interchangeable lens barrel of a single lens reflex camera as an embodiment of the image pickup device of the present invention. A fixing barrel 712, a linear guide barrel 713, and a front lens group barrel 714 are fixed to the detachable mount 711 with a camera. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. Relative displacement between the linear guide barrel 713 and the cam ring 715 is restricted in the optical axis direction by the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

Low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 with respect to the fixing barrel 712 around the optical axis.

The large-diameter portion 722a of the driven roller 722 and the mount side end face 724b of the manual focus ring are in contact with each other by means of the pressure applied by the force of a wave washer 726 for pressing the ultrasonic motor 725 toward the front of the lens. Similarly, the small-diameter portion 722b of the driven roller 722 and the connecting member 729 are in contact with each other by means of an adequate pressure by the force of the wave washer 726 for pressing the ultrasonic motor 725 toward the front of the lens. The wave washer 726 is restricted in the movement toward the mount direction by a washer 732 bayonet-connected to the fixing barrel 712. The spring force (biasing force) generated by the wave washer 726 is transmitted to the ultrasonic motor 725 and further to the driven roller 722 and thereby also serves as a pressing force of the manual focus ring 724 against the mount side end face 712a of the fixing barrel 712. That is, the manual focus ring 724 is incorporated so as to be pressed to the mount side end face 712a of the fixing barrel 712 via the low friction sheet 733.

Consequently, when the ultrasonic motor 725 is driven so as to turn with respect to the fixing barrel 712 by controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

When a turning force around the optical axis is applied to the manual focus ring 724 from a manual manipulation input unit (not shown), the mount side end face 724b of the manual focus ring 724 is brought into a pressing-contact with the large-diameter portion 722a of the driven roller 722. As a result, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from being turned (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation is transmitted to the cam ring 715 via the focus keys 728 to turn the cam ring 715 around the optical axis. As a result, the rear lens group barrel 716 that is restricted in turning by the cam roller 717a and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of the optical apparatus of the present invention. The present invention can be applied to any optical apparatus having an ultrasonic motor in the driving unit, such as a compact camera or an electronic still camera, regardless of the types of cameras.

Vibratory Device and Dust-Removing Device

Vibratory devices for, for example, conveying or removing particles, powder, or a liquid are widely used in electronic apparatuses.

A dust-removing device including the piezoelectric material of the present invention will now be described as an example of the vibratory device of the present invention. The vibratory device according to the present invention includes a vibratory component provided with a diaphragm including the piezoelectric element or the multilayered piezoelectric element. The dust-removing device according to the present invention at least included the vibratory device in a vibratory unit.

Figure 9A:
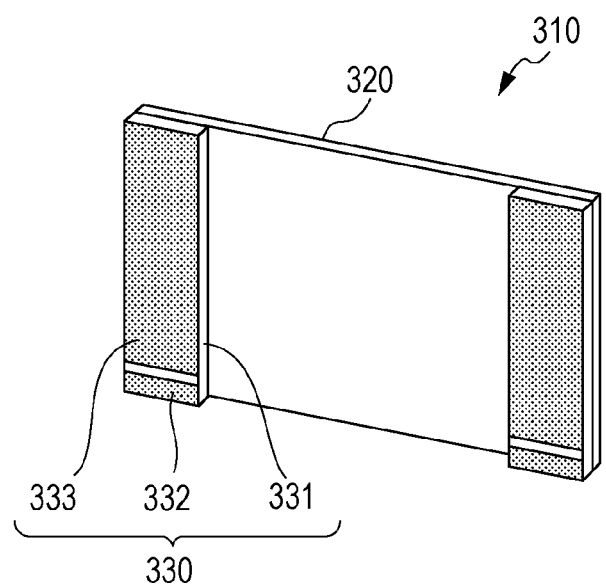
FIGS. 9A and 9B are schematic diagrams illustrating an embodiment when a vibratory device of the present invention is used as a dust-removing device.
Figure 9B:
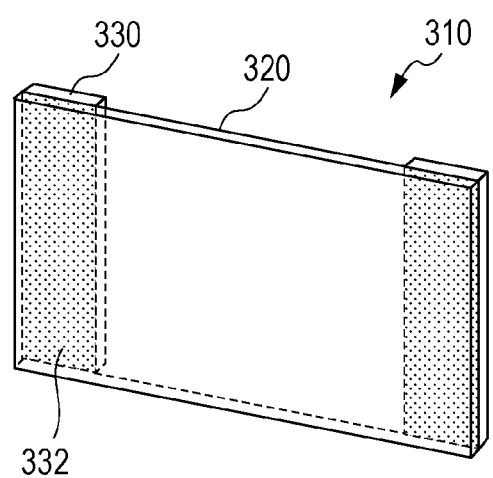

FIGS. 9A and 9B are schematic diagrams illustrating an embodiment when a vibratory device of the present invention is used as a dust-removing device. The dust-removing device 310 can also be used as a vibratory device and is constituted of a tabular piezoelectric element 330 and a diaphragm 320. The piezoelectric element 330 may be a multilayered piezoelectric element of the present invention. The diaphragm 320 may be made of any material. When the dust-removing device 310 is used in an optical device, a transparent material or a light-reflective material can be used as the diaphragm 320.

Figure 10A:
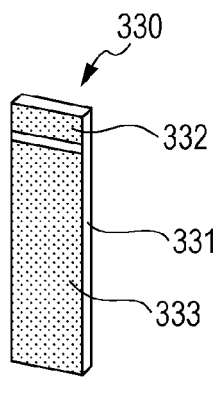
FIGS. 10A to 10C are schematic diagrams illustrating the configuration of a piezoelectric element in a dust-removing device of the present invention.
Figure 10B:
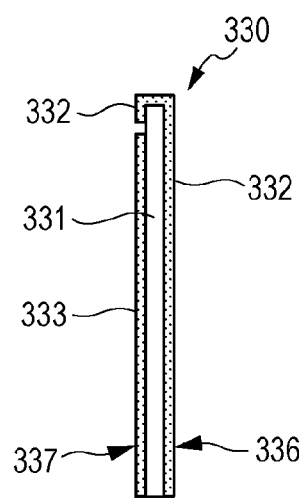
Figure 10C:
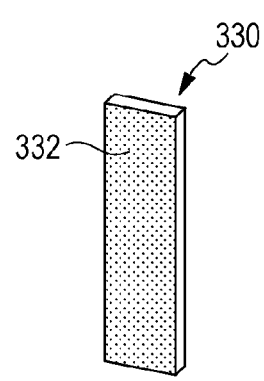

FIGS. 10A to 10C are schematic diagrams illustrating the configuration of a piezoelectric element 330 shown in FIGS. 9A and 9B. FIGS. 10A and 10C illustrate the structures of the front and the rear faces of the piezoelectric element 330, and FIG. 10B illustrates the structure of the side face. As shown in FIGS. 9A and 9B and FIG. 10, the piezoelectric element 330 is composed of a piezoelectric material 331, a first electrode 332, and a second electrode 333. The first electrode 332 and the second electrode 333 are respectively arranged on the surfaces of the tabular piezoelectric material 331 so as to oppose each other. As in the piezoelectric element shown in FIGS. 9A and 9B, the piezoelectric element 330 may be a multilayered piezoelectric element of the present invention. In such a case, the piezoelectric material 331 has a structure having piezoelectric material layers and internal electrodes alternately arranged, and the internal electrodes are alternately short-circuited with the first electrode 332 or the second electrode 333 to give a driving waveform to each layer of the piezoelectric material with different phases. The face of the first electrode 332 of the piezoelectric element 330 shown in FIG. 10C is a first electrode face 336, and the face of the second electrode 333 of the piezoelectric element 330 shown in FIG. 10A is a second electrode face 337.

Here, the electrode face in the present invention indicates the face of the piezoelectric element on which the electrode is disposed. For example, as shown in FIGS. 10A to 10C, the first electrode 332 may go around to the second electrode face 337.

As shown in FIGS. 9A and 9B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust-removing device 310 of the present invention is a device for removing foreign substance such as dust adhered to the surface of the diaphragm 320 by the out-of-plane vibration of the diaphragm 320. The term "out-of-plane vibration" refers to elastic vibration that displaces the diaphragm in the optical axis direction, i.e., in the thickness direction of the diaphragm.

Figure 11A:
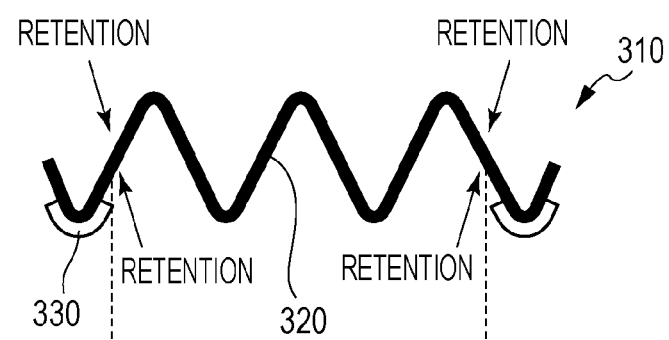
FIGS. 11A and 11B are schematic diagrams illustrating the vibration principle of a dust-removing device of the present invention.
Figure 11B:
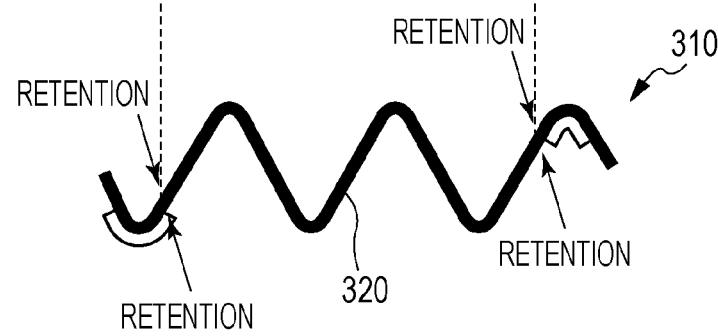

FIGS. 11A and 11B are schematic diagrams illustrating the vibration principle of the dust-removing device 310 of the present invention. FIG. 11A shows a state of generating out-of-plane vibration in the diaphragm 320 by applying alternating voltages with the same phase to a pair of piezoelectric elements 330. The polarization direction of the piezoelectric material constituting the pair of piezoelectric elements 330 is identical with the thickness direction of the piezoelectric elements 330. The dust-removing device 310 is driven by a seventh vibration mode. FIG. 11B shows a state of generating out-of-plane vibration in the diaphragm 320 by applying alternating voltages with opposite phases by 180° to a pair of piezoelectric elements 330. The dust-removing device 310 is driven by a sixth vibration mode. The dust-removing device 310 of the present invention can effectively remove dust adhered to the surface of a diaphragm by properly using at least two vibration modes.

Image Pickup Device

Figure 12:
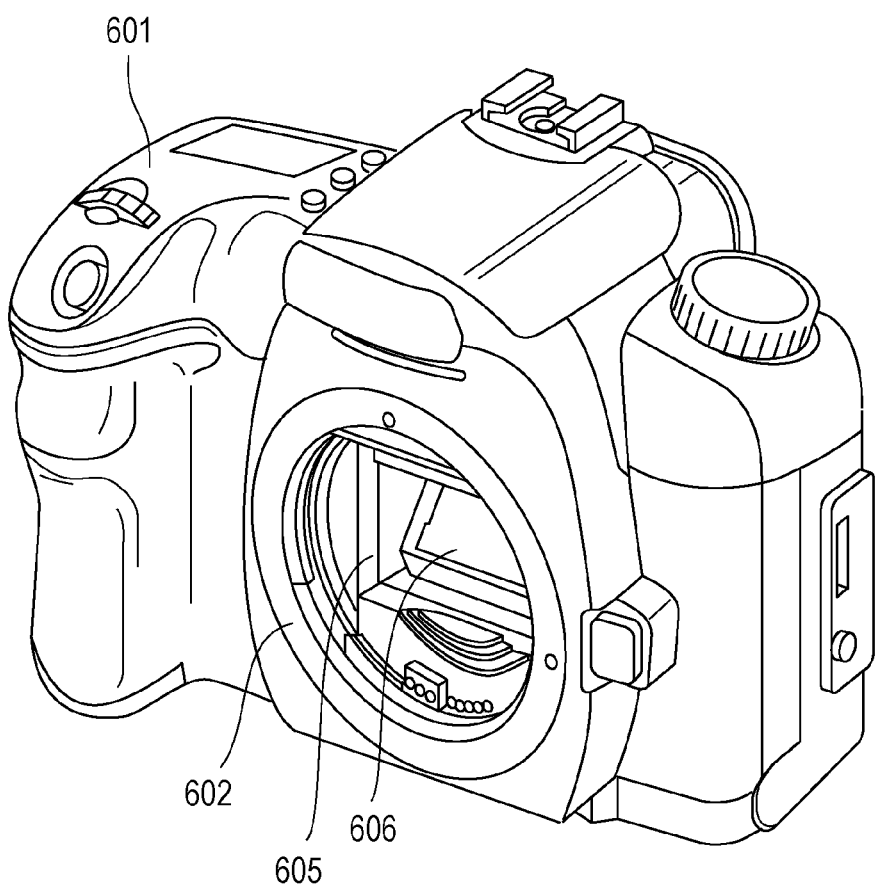
FIG. 12 is a schematic diagram illustrating an embodiment of an image pickup device of the present invention.
Figure 13:
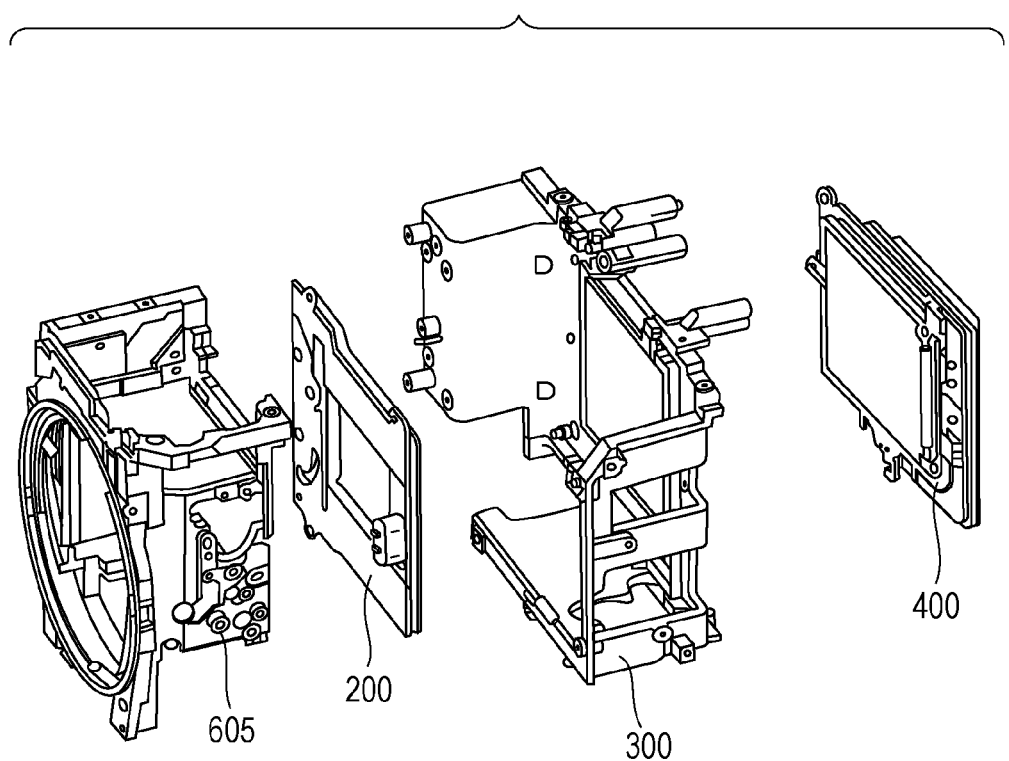
FIG. 13 is a schematic diagram illustrating an embodiment of an image pickup device of the present invention.

The image pickup device of the present invention will now be described. The image pickup device of the present invention at least includes the dust-removing device of the present invention and an image pickup element unit. The diaphragm of the dust-removing device and the light-receiving surface of the image pickup element unit are disposed on the same axis, and the dust-removing device is disposed on the light-receiving surface side of the image pickup element unit. FIGS. 12 and 13 are diagrams illustrating a digital single lens reflex camera as an embodiment of the image pickup device of the present invention.

FIG. 12 is a front perspective view of a camera body 601 viewed from the object side, in a state in which the image pickup lens unit is removed. FIG. 13 is an exploded perspective view illustrating the schematic structure of the inside of the camera for describing the dust-removing device of the present invention and the surrounding structure of a pickup unit 400.

A mirror box 605 into which image pickup light beams that passed through the image pickup lens are guided is disposed inside the camera body 601. Main mirror (quick return mirror) 606 is disposed inside the mirror box 605. The main mirror 606 can take a state in which the main mirror 606 is held at an angle of 45° with respect to the image pickup optical axis for guiding image pickup light beams to the direction of the penta roof mirror (not shown) and a state in which the main mirror 606 is held at a position evacuated from image pickup light beams for guiding the image pickup light beams to the direction of the image pickup element (not shown).

The mirror box 605 and a shutter unit 200 are disposed on the object side of the body chassis 300 serving as the skeleton of the camera body in this order from the object side. Furthermore, an image pickup unit 400 is disposed on the photographer side of the body chassis 300. The image pickup unit 400 is set to the clamp face of the mount portion 602 serving as the basis for setting the image pickup lens unit such that the image pickup face of the image pickup element is parallel to the clamp face with a predetermined distance therebetween.

The image pickup unit 400 is constituted of the diaphragm of a dust-removing device and an image pickup element unit. The diaphragm of the dust-removing device and the light-receiving surface of the image pickup element unit are disposed on the same axis.

Herein, a digital single lens reflex camera has been described as an example of the image pickup device of the present invention. The image pickup device may be, for example, an image pickup lens interchangeable camera such as a mirror-less digital single lens camera not having the mirror box 605. The present invention can also be applied to apparatuses required to remove dust adhering to the surfaces of, in particular, the optical parts of various image pickup devices, such as image pickup unit interchangeable video cameras, copiers, facsimile machines, and scanners, and electronic electric apparatuses having image pickup devices.

Electronic Apparatus

The electronic apparatus of the present invention will now be described. The electronic apparatus of the present invention includes a piezoelectric acoustic component having the piezoelectric element or the multilayered piezoelectric element.

Figure 14:
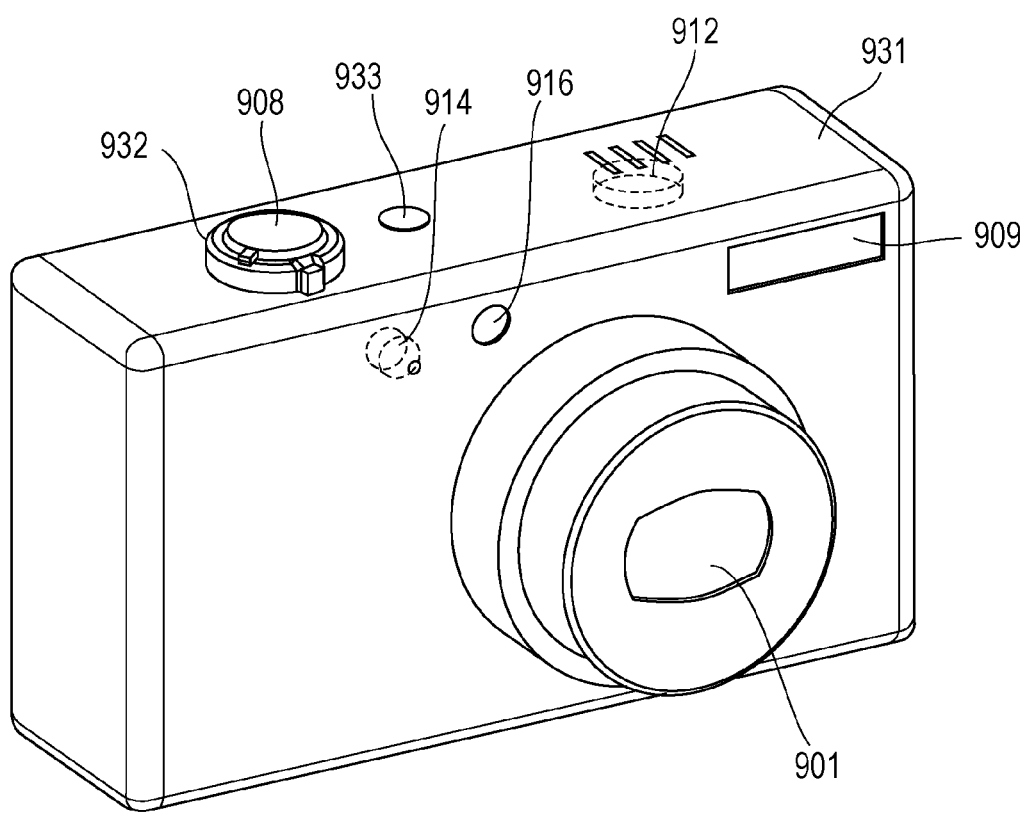
FIG. 14 is a schematic diagram illustrating an embodiment of an electronic apparatus of the present invention.

FIG. 14 is a perspective general view of a digital camera body 931, an embodiment of the electronic apparatus of the present invention, viewed from the front. An optical device 901, a microphone 914, a stroboscope light emitting unit 909, and an assist light unit 916 are disposed on the front of the body 931. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component including the piezoelectric element or the multilayered piezoelectric element of the present invention is used in at least one of the microphone 914 and the loudspeaker 912.

Herein, a digital camera has been described as the electronic apparatus of the present invention. The electronic apparatus of the present invention can also be applied to electronic apparatuses having various piezoelectric acoustic components such as sound reproducers, recorders, cellular phones, and information terminals.

The piezoelectric material of the present invention has satisfactory and stable piezoelectric constant and mechanical quality factor in a wide practical use temperature range. Since the piezoelectric material of the present invention does not contain lead, its load on the environment is low. Accordingly, the piezoelectric material of the present invention can be used in various apparatuses including a large amount of the piezoelectric material, such as liquid discharge heads, liquid discharge devices, ultrasonic motors, optical apparatuses, vibratory devices, dust-removing devices, image pickup devices, and electronic apparatuses, without any problem. The piezoelectric material of the present invention can also be used in apparatuses such as ultrasonic vibrators, piezoelectric actuators, piezoelectric sensors, and ferroelectric memories.

EXAMPLES

The present invention will now be more specifically described by Examples, but the present invention is not limited to the following Examples.

Piezoelectric Material of Example 1

A piezoelectric material of this Example was produced. A barium titanate raw material powder having an average particle diameter of 100 nm and a purity of 99.999% or more, a calcium titanate raw material powder having an average particle diameter of 300 nm and a purity of 99.999% or more, and a calcium zirconate raw material powder having an average particle diameter of 300 nm and a purity of 99.999% or more were produced by a solid-phase method. The amount of Mg contained in each of the raw material powders (the barium titanate, calcium titanate, and calcium zirconate raw material powders) was measured by ICP emission spectrometry and was 0.0001 parts by weight based on 100 parts by weight of the raw material powder. The barium titanate, the calcium titanate, and the calcium zirconate were weighed at a molar ratio of 81.3:12.7:6.0. In order to adjust the "a" showing the ratio of the molar amount of Ba and Ca at the A site to the molar amount of Ti and Zr at the B site, 0.010 mol of barium oxalate was added to the mixture, followed by dry blending with a ball mill for 24 hours.

The amount of Mg contained in the resulting powder mixture was measured by ICP emission spectrometry. The amount of Mg was 0.0001 parts by weight based on 100 parts by weight of other materials in terms of chemical formula:

$(Ba_{0.813}Ca_{0.187})_{1.002}(Ti_{0.940}Zr_{0.060})O_3$. 

In order to granulate the resulting mixed powder, manganese(II) acetate in an amount of 0.12 parts by weight of Mn on a metal basis and a PVA binder in an amount of 3 parts by weight each based on the sum of the weighed amounts (total amount) of barium titanate, calcium titanate, calcium zirconate, and barium oxalate were sprayed with a spray dryer so as to adhere to the mixed powder surfaces.

A mold of which surface was treated with a magnesium-free release agent was filled with the resulting granulated powder, and the granulated powder was formed into a disk-shaped compact by applying a molding pressure of 200 MPa to the mold with a press molding machine. The compact may be further pressed with a cold isostatic pressing molding machine. In also such a case, similar results were obtained. The resulting compact was put in an electric furnace, was held at a maximum temperature of 1350° C. for 5 hours, and was sintered in the atmosphere over 24 hours in total to give a ceramic piezoelectric material of this Example.

The average equivalent circular diameter and the relative density of the crystal grains constituting the piezoelectric material of this Example were evaluated and were 8.1 μm and 99.0%, respectively. The crystal grains were mainly observed with a polarizing microscope, but the crystal grains having a small grain diameter were observed with a scanning electron microscope (SEM). The average equivalent circular diameter was calculated from the observation results. The relative density was evaluated by an Archimedes's method.

The both surfaces of the piezoelectric material of the present invention were ground into a thickness of 0.5 mm, and the crystal structure was analyzed by X-ray diffraction. Only a peak corresponding to a perovskite structure was observed. The composition was evaluated by X-ray fluorescence analysis. The result demonstrates that the main component was a metal oxide represented by a chemical formula: $(Ba_{0.813}Ca_{0.187})_{1.002}(Ti_{0.940}Zr_{0.060})O_3$ and that 0.12 parts by weight of Mn and 0.0001 parts by weight of Mg were contained in 100 parts by weight of the metal oxide.

The composition of other metal components after sintering coincided with the weighed composition. The amounts of elements other than Ba, Ca, Ti, Zr, Mn, and Mg were each lower than the detection limit. There was no significant difference in average equivalent circular diameter between after sintering and after grinding.

Piezoelectric Materials in Examples 2 to 26

A piezoelectric material of each Example was produced. Barium titanate, calcium titanate, and calcium zirconate powders equivalent to those used in Example 1 were weighed at molar ratios shown in Table 1. In order to adjust the "a" showing the ratio of the molar amount of Ba and Ca at the A site to the molar amount of Ti and Zr at the B site, barium oxalate was added to the mixtures in amounts shown in Table 1.

In Examples 21 to 26, in order to adjust the Mg content, magnesium oxide was added in an amount of 0.0004 parts by weight (Example 21), 0.0009 parts by weight (Example 22), 0.0049 parts by weight (Example 23), 0.0149 parts by weight (Example 24), 0.0499 parts by weight (Example 25), and 0.0999 parts by weight (Example 26) based on 100 parts by weight of the sum of weighed amounts (total amount) of the barium titanate, calcium titanate, calcium zirconate, and barium oxalate powders in terms of chemical formula: $(Ba_{0.813}Ca_{0.187})_{1.002}(Ti_{0.940}Zr_{0.060})O_3$. The mixtures of these powders were each mixed by dry blending with a ball mill for 24 hours.

The resulting mixed powders were each granulated by spraying manganese(II) acetate in amounts shown in Table 1 as Mn on a metal basis and a PVA binder in an amount of 3 parts by weight each based on the sum of weighed amounts (total amount) of barium titanate, calcium titanate, calcium zirconate, and barium oxalate with a spray dryer so as to adhere to the mixed powder surfaces. As in Example 1, a mold was filled with the resulting granulated powder, and the granulated powder was formed into a disk-shaped compact by applying a molding pressure of 200 MPa with a press molding machine.

The compact may be further pressed with a cold isostatic pressing molding machine. The resulting compact was put in an electric furnace, was held at a maximum temperature of 1350° C. to 1480° C. for 5 hours, and was sintered in the atmosphere over 24 hours in total to give a ceramic piezoelectric material of the present invention. The maximum temperature was raised with an increase in amount of Ca. The average equivalent circular diameter and the relative density of the resulting crystal grains constituting each piezoelectric material were evaluated as in Example 1. The results are shown in Table 2.

As in Example 1, the piezoelectric material of the present invention was ground so that the material has a thickness of 0.5 mm, and the crystal structure was analyzed by X-ray diffraction. Only a peak corresponding to a perovskite structure was observed in each sample. As in Example 1, the composition was evaluated. The results are shown in Table 3. The amounts of elements other than Ba, Ca, Ti, Zr, Mn, and Mg were each lower than the detection limit. There were no significant differences in the size and the appearance of the crystal grains between after sintering and after grinding.

Piezoelectric Materials of Comparative Examples 1 to 10

A piezoelectric material of each Comparative Example was produced. As in Examples 1 to 26, barium titanate, calcium titanate, calcium zirconate, and barium oxalate were weighed at molar ratios shown in Table 1, and the mixtures (excluding Comparative Example 8) were each mixed by dry blending with a ball mill for 24 hours. In Comparative Example 8, in order to adjust the Mg content, magnesium oxide was added to the mixture in an amount of 0.1199 parts by weight based on 100 parts by weight of the sum of weighed amounts (total amount) of barium titanate, calcium titanate, calcium zirconate, and barium oxalate in terms of chemical formula: $(Ba_{0.813}Ca_{0.187})_{1.005}(Ti_{0.940}Zr_{0.060})O_3$. The mixture was mixed by dry blending with a ball mill for 24 hours.

The resulting mixed powders were each granulated by spraying manganese(II) acetate in amounts shown in Table 1 as Mn on a metal basis and a PVA binder in an amount of 3 parts by weight each based on the sum of weighed amounts of barium titanate, calcium titanate, calcium zirconate, and barium oxalate with a spray dryer so as to adhere to the mixed powder surfaces. Piezoelectric materials for comparison were produced from the resulting granulated powders as in Examples 1 to 26.

Table 2 shows the average equivalent circular diameters and the relative densities of the crystal grains constituting the piezoelectric materials. The crystal grains and the relative density were evaluated as in Examples 1 to 26. That is, the piezoelectric materials for comparison were ground so that each material has a thickness of 0.5 mm, and the crystal structure was analyzed by X-ray diffraction, as in Examples 1 to 26. Only a peak corresponding to a perovskite structure was observed in each sample. Table 3 shows the compositions determined by X-ray fluorescence analysis.

TABLE 1

| | $BaTiO_3$ [mol] | $CaTiO_3$ [mol] | $CaZrO_3$ [mol] | $BaC_2O_4$ [mol] | Addition amount of Mn [parts by weight] | Mg content [parts by weight] |
|---|---|---|---|---|---|---|
| Example 1 | 81.3 | 12.7 | 6.0 | 0.010 | 0.12 | 0.0001 |
| Example 2 | 86.0 | 8.0 | 6.0 | 0.009 | 0.12 | 0.0001 |
| Example 3 | 84.0 | 10.0 | 6.0 | 0.009 | 0.12 | 0.0001 |
| Example 4 | 84.0 | 10.9 | 5.1 | 0.010 | 0.12 | 0.0001 |
| Example 5 | 83.0 | 10.5 | 6.5 | 0.009 | 0.12 | 0.0001 |
| Example 6 | 87.5 | 8.4 | 4.1 | 0.008 | 0.12 | 0.0001 |
| Example 7 | 87.5 | 7.4 | 5.1 | 0.008 | 0.12 | 0.0001 |
| Example 8 | 87.5 | 6.5 | 6.0 | 0.008 | 0.12 | 0.0001 |
| Example 9 | 87.5 | 5.6 | 6.9 | 0.008 | 0.12 | 0.0001 |
| Example 10 | 87.5 | 5.1 | 7.4 | 0.008 | 0.12 | 0.0001 |
| Example 11 | 81.7 | 14.2 | 4.1 | 0.010 | 0.12 | 0.0001 |
| Example 12 | 75.8 | 19.1 | 5.1 | 0.009 | 0.12 | 0.0001 |
| Example 13 | 75.8 | 17.3 | 6.9 | 0.009 | 0.12 | 0.0001 |
| Example 14 | 70.0 | 25.9 | 4.1 | 0.009 | 0.12 | 0.0001 |
| Example 15 | 70.0 | 23.1 | 6.9 | 0.009 | 0.12 | 0.0001 |
| Example 16 | 70.0 | 22.6 | 7.4 | 0.010 | 0.12 | 0.0001 |
| Example 17 | 84.0 | 10.0 | 6.0 | 0.011 | 0.16 | 0.0001 |
| Example 18 | 84.0 | 10.0 | 6.0 | 0.013 | 0.20 | 0.0001 |
| Example 19 | 84.0 | 10.0 | 6.0 | 0.016 | 0.24 | 0.0001 |
| Example 20 | 84.0 | 10.0 | 6.0 | 0.029 | 0.40 | 0.0001 |
| Example 21 | 81.3 | 12.7 | 6.0 | 0.017 | 0.24 | 0.0005 |
| Example 22 | 81.3 | 12.7 | 6.0 | 0.017 | 0.24 | 0.0010 |
| Example 23 | 81.3 | 12.7 | 6.0 | 0.017 | 0.24 | 0.0050 |
| Example 24 | 81.3 | 12.7 | 6.0 | 0.017 | 0.24 | 0.0150 |
| Example 25 | 81.3 | 12.7 | 6.0 | 0.014 | 0.24 | 0.0500 |
| Example 26 | 81.3 | 12.7 | 6.0 | 0.017 | 0.24 | 0.1000 |
| Comparative Example 1 | 100.0 | 0.0 | 0.0 | 0.009 | 0.12 | 0.0001 |
| Comparative Example 2 | 84.0 | 16.0 | 0.0 | 0.010 | 0.12 | 0.0001 |
| Comparative Example 3 | 68.0 | 26.0 | 6.0 | 0.010 | 0.12 | 0.0001 |
| Comparative Example 4 | 84.0 | 6.0 | 10.0 | 0.009 | 0.12 | 0.0001 |
| Comparative Example 5 | 84.0 | 10.0 | 6.0 | 0.005 | 0.00 | 0.0001 |
| Comparative Example 6 | 84.0 | 10.0 | 6.0 | 0.844 | 0.10 | 0.0001 |
| Comparative Example 7 | 84.0 | 10.0 | 6.0 | 0.031 | 0.45 | 0.0001 |
| Comparative Example 8 | 81.3 | 12.7 | 6.0 | 0.017 | 0.24 | 0.1200 |
| Comparative Example 9 | 84.0 | 10.0 | 6.0 | 0.006 | 0.12 | 0.0001 |
| Comparative Example 10 | 84.0 | 10.0 | 6.0 | 0.027 | 0.12 | 0.0001 |

TABLE 2

| | Average equivalent circular diameter [μm] | Relative density [%] |
|---|---|---|
| Example 1 | 8.1 | 99 |
| Example 2 | 5.7 | 98 |
| Example 3 | 6.8 | 98.5 |
| Example 4 | 5.5 | 98 |
| Example 5 | 4.8 | 98.5 |
| Example 6 | 4.6 | 97.3 |
| Example 7 | 5.2 | 98.2 |
| Example 8 | 5.8 | 97.2 |
| Example 9 | 4.2 | 97.5 |
| Example 10 | 4.8 | 96.9 |
| Example 11 | 6.9 | 98.7 |
| Example 12 | 5.4 | 97.2 |
| Example 13 | 3.8 | 96.5 |
| Example 14 | 4.3 | 95.4 |
| Example 15 | 3.1 | 95.1 |
| Example 16 | 3.8 | 96.2 |
| Example 17 | 5.8 | 98.5 |
| Example 18 | 5.4 | 98.2 |

TABLE 2-continued

| | Average equivalent circular diameter [μm] | Relative density [%] |
|---|---|---|
| Example 19 | 4.5 | 98.2 |
| Example 20 | 5.5 | 97.5 |
| Example 21 | 5.8 | 97.7 |
| Example 22 | 6.2 | 98.1 |
| Example 23 | 5.8 | 98.2 |
| Example 24 | 5.4 | 98.4 |
| Example 25 | 5.7 | 98.5 |
| Example 26 | 6.1 | 98.7 |
| Comparative Example 1 | 6.4 | 97.8 |
| Comparative Example 2 | 2.3 | 93.5 |
| Comparative Example 3 | 3.1 | 92.1 |
| Comparative Example 4 | 3.5 | 93.1 |
| Comparative Example 5 | 4.5 | 95.6 |
| Comparative Example 6 | 3.9 | 96.2 |
| Comparative Example 7 | 12.5 | 96.5 |
| Comparative Example 8 | 5.2 | 94.8 |
| Comparative Example 9 | 172 | 97.8 |
| Comparative Example 10 | 1.2 | 91.5 |

TABLE 3

| | x | y | a | Mn amount [parts by weight] | Mg amount [parts by weight] |
|---|---|---|---|---|---|
| Example 1 | 0.187 | 0.060 | 1.002 | 0.12 | 0.0001 |
| Example 2 | 0.140 | 0.060 | 1.002 | 0.12 | 0.0001 |
| Example 3 | 0.160 | 0.060 | 1.002 | 0.12 | 0.0001 |
| Example 4 | 0.160 | 0.051 | 1.002 | 0.12 | 0.0001 |
| Example 5 | 0.170 | 0.065 | 1.002 | 0.12 | 0.0001 |
| Example 6 | 0.125 | 0.041 | 1.001 | 0.12 | 0.0001 |
| Example 7 | 0.125 | 0.051 | 1.001 | 0.12 | 0.0001 |
| Example 8 | 0.125 | 0.060 | 1.001 | 0.12 | 0.0001 |
| Example 9 | 0.125 | 0.069 | 1.001 | 0.12 | 0.0001 |
| Example 10 | 0.125 | 0.074 | 1.001 | 0.12 | 0.0001 |
| Example 11 | 0.183 | 0.041 | 1.002 | 0.12 | 0.0001 |
| Example 12 | 0.242 | 0.051 | 1.001 | 0.12 | 0.0001 |
| Example 13 | 0.242 | 0.069 | 1.001 | 0.12 | 0.0001 |
| Example 14 | 0.300 | 0.041 | 1.001 | 0.12 | 0.0001 |
| Example 15 | 0.300 | 0.069 | 1.001 | 0.12 | 0.0001 |
| Example 16 | 0.300 | 0.074 | 1.002 | 0.12 | 0.0001 |
| Example 17 | 0.160 | 0.060 | 1.002 | 0.16 | 0.0001 |
| Example 18 | 0.160 | 0.060 | 1.002 | 0.20 | 0.0001 |
| Example 19 | 0.160 | 0.060 | 1.004 | 0.24 | 0.0001 |
| Example 20 | 0.160 | 0.060 | 1.010 | 0.40 | 0.0001 |
| Example 21 | 0.187 | 0.060 | 1.005 | 0.24 | 0.0005 |
| Example 22 | 0.187 | 0.060 | 1.005 | 0.24 | 0.0010 |
| Example 23 | 0.187 | 0.060 | 1.005 | 0.24 | 0.0050 |
| Example 24 | 0.187 | 0.060 | 1.005 | 0.24 | 0.0150 |
| Example 25 | 0.187 | 0.060 | 1.002 | 0.24 | 0.0500 |
| Example 26 | 0.187 | 0.060 | 1.005 | 0.24 | 0.1000 |
| Comparative Example 1 | 0.000 | 0.000 | 1.002 | 0.12 | 0.0001 |
| Comparative Example 2 | 0.160 | 0.000 | 1.002 | 0.12 | 0.0001 |
| Comparative Example 3 | 0.320 | 0.060 | 1.002 | 0.12 | 0.0001 |
| Comparative Example 4 | 0.160 | 0.100 | 1.002 | 0.12 | 0.0001 |
| Comparative Example 5 | 0.160 | 0.060 | 1.002 | 0.00 | 0.0001 |
| Comparative Example 6 | 0.160 | 0.060 | 1.002 | 0.10 | 0.0001 |
| Comparative Example 7 | 0.160 | 0.060 | 1.010 | 0.45 | 0.0001 |
| Comparative Example 8 | 0.187 | 0.060 | 1.005 | 0.24 | 0.1200 |
| Comparative Example 9 | 0.160 | 0.060 | 0.999 | 0.12 | 0.0001 |
| Comparative Example 10 | 0.160 | 0.060 | 1.020 | 0.12 | 0.0001 |

Figure 15:
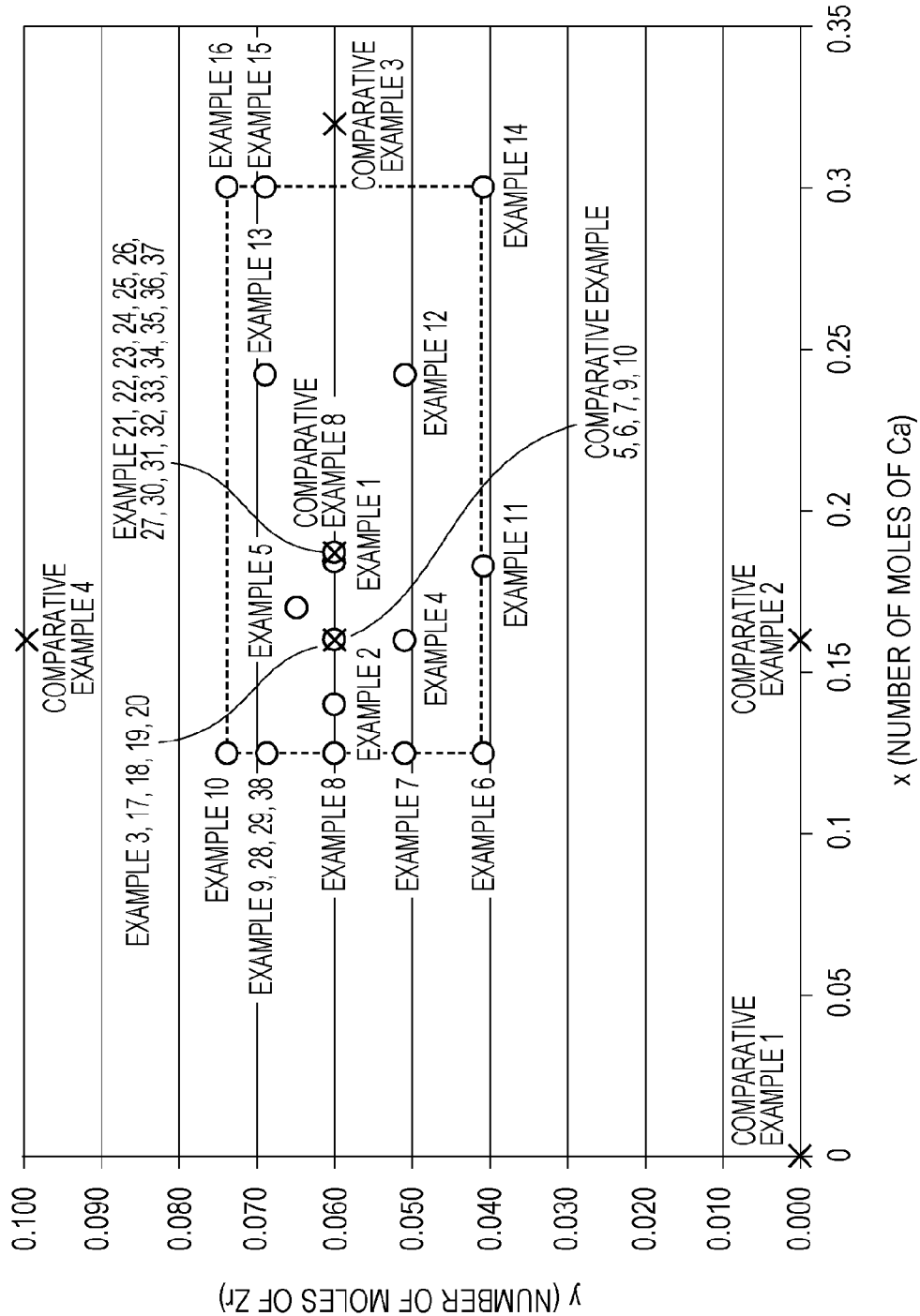
FIG. 15 is a phase diagram showing a relationship between the x-values and the y-values of Formula (1) in the piezoelectric materials of Examples of the present invention and Comparative Examples.

FIG. 15 shows a relationship between the x-values and the y-values of the piezoelectric materials of the present invention in Examples 1 to 26 and the piezoelectric materials for comparison in Comparative Examples 1 to 10, where the area surrounded by the dotted line is a range of the x-values and the y-values of perovskite-type metal oxides represented by Formula (1).

Piezoelectric Elements of Examples 1 to 26

Piezoelectric elements were produced using the piezoelectric materials in Examples 1 to 26. Gold electrodes each having a thickness of 400 nm were formed on both surfaces of the ground disk-shaped piezoelectric materials by DC sputtering. Incidentally, a titanium adhesive layer having a thickness of 30 nm was formed between the electrode and the piezoelectric material. The piezoelectric material provided with electrodes was cut into a strip-like piezoelectric element of 10×2.5×0.5 mm of the present invention. The resulting piezoelectric element was set on a hot plate of a temperature of 60° C. to 100° C. and was polarized by application of an electric field of 1 kV/mm for 30 minutes.

The static characteristics of the polarized piezoelectric elements, i.e., the Curie temperature, dielectric loss, piezoelectric constant $d_{31}$, force factor $d_{31} \times Y_{11}$, and mechanical quality factor (Qm), were evaluated. The results are shown in Tables 4 to 6.

Phase Transition Point

The "phase transition point" in the table shows the results whether the structural phase transition point is present within a range of −25° C. to 100° C. A piezoelectric material having a structural phase transition point within a temperature range of −25° C. to 100° C. is shown as "Yes", and a piezoelectric material not having a structural phase transition point within the range is shown as "No".

Curie Temperature

The Curie temperature (Tc) was determined from the temperature showing the maximum dielectric constant determined by measuring dielectric constants by changing the temperature with a small AC electric field having a frequency of 1 kHz.

Dielectric loss, piezoelectric constant $d_{31}$, force factor $d_{31} \times Y_{11}$, and mechanical quality factor (Qm)

The dielectric loss, piezoelectric constant $d_{31}$, Young's modulus $Y_{11}$, and mechanical quality factor (Qm) were determined by a resonance-antiresonance method, and their absolute values are shown in the tables.

All the samples of Examples had a piezoelectric constant $d_{31}$ of 60 [pC/N] or more and a dielectric loss of 0.4% or less. In addition, the piezoelectric constant $d_{33}$ (not shown) measured with a $d_{33}$ meter using the Berlincourt method principle was 120 [pC/N] or more in all samples. In all Examples, piezoelectric elements produced by baking a silver paste showed characteristics equivalent to those produced by baking a gold paste.

Piezoelectric Elements of Comparative Example 1 to 10

Piezoelectric elements for comparison were produced using the piezoelectric materials in Comparative Example 1 to 10 as in Examples 1 to 26. The piezoelectric elements were evaluated as in Examples 1 to 26. The results are shown in Tables 4 to 6.

The piezoelectric material of Comparative Example 1 did not contain Ca and Zr and thereby had a phase transition point within a temperature range of −25° C. to 100° C., resulting in a narrow temperature range at which the piezoelectric element can be used.

The piezoelectric material of Comparative Example 2 did not contain Zr and thereby had a low piezoelectric constant $d_{31}$ of 38 [pC/N].

The piezoelectric material of Comparative Example 3 contained an excessive amount of Ca and thereby caused insufficient sintering to give insufficient grain growth, a small piezoelectric constant, and a high dielectric loss.

The piezoelectric material of Comparative Example 4 contained an excessive amount of Zr and thereby had a low Curie temperature of 80° C. and also had a phase transition point within a temperature range of −25° C. to 100° C., resulting in a narrow temperature range at which the piezoelectric element can be used.

equivalent circular diameter highly exceeding 10 μm to significantly reduce the mechanical strength.

In Comparative Example 10, the value of "a" was large, i.e., 1.020, and the sintering did not sufficiently progressed to give insufficient grain growth. As a result, the piezoelectric element in Comparative Example 10 had a small piezoelectric constant $d_{31}$ of 35 and a large dielectric loss of 0.9%.

TABLE 4

|  | Phase transition point | Curie temperature [° C.] | Piezoelectric constant $|d_{31}|$ [pC/N] | Dielectric loss [%] | Mechanical quality factor Qm |
|---|---|---|---|---|---|
| Example 1 | No | 106 | 88 | 0.3 | 1100 |
| Example 2 | No | 107 | 105 | 0.2 | 920 |
| Example 3 | No | 106 | 92 | 0.3 | 950 |
| Example 4 | No | 112 | 85 | 0.3 | 1060 |
| Example 5 | No | 104 | 94 | 0.3 | 1020 |
| Example 6 | No | 116 | 83 | 0.2 | 980 |
| Example 7 | No | 112 | 95 | 0.3 | 950 |
| Example 8 | No | 107 | 110 | 0.2 | 890 |
| Example 9 | No | 104 | 115 | 0.2 | 920 |
| Example 10 | Yes | 100 | 117 | 0.2 | 930 |
| Example 11 | No | 116 | 75 | 0.3 | 940 |
| Example 12 | No | 112 | 70 | 0.2 | 980 |
| Example 13 | No | 104 | 75 | 0.2 | 970 |
| Example 14 | No | 116 | 65 | 0.2 | 920 |
| Example 15 | No | 104 | 68 | 0.2 | 950 |
| Example 16 | No | 102 | 70 | 0.2 | 970 |
| Example 17 | No | 106 | 87 | 0.3 | 1050 |
| Example 18 | No | 104 | 82 | 0.3 | 1150 |
| Example 19 | No | 104 | 79 | 0.4 | 1220 |
| Example 20 | No | 104 | 70 | 0.5 | 1270 |
| Example 21 | No | 106 | 85 | 0.2 | 1220 |
| Example 22 | No | 106 | 88 | 0.3 | 1320 |
| Example 23 | No | 106 | 90 | 0.3 | 1250 |
| Example 24 | No | 106 | 89 | 0.3 | 1150 |
| Example 25 | No | 106 | 85 | 0.3 | 1000 |
| Example 26 | No | 106 | 82 | 0.3 | 900 |
| Comparative Example 1 | Yes | 127 | 115 | 0.2 | 1320 |
| Comparative Example 2 | No | 127 | 38 | 0.3 | 780 |
| Comparative Example 3 | No | 104 | 25 | 0.5 | 750 |
| Comparative Example 4 | Yes | 80 | 125 | 0.2 | 770 |
| Comparative Example 5 | No | 106 | 102 | 0.2 | 220 |
| Comparative Example 6 | No | 106 | 95 | 0.2 | 390 |
| Comparative Example 7 | No | 106 | 62 | 0.6 | 1310 |
| Comparative Example 8 | No | 106 | 79 | 0.4 | 750 |
| Comparative Example 9 | No | 105 | 65 | 0.2 | 970 |
| Comparative Example 10 | No | 106 | 35 | 0.2 | 280 |

Table 5 shows the piezoelectric constant, dielectric loss, and mechanical quality factor of each piezoelectric material of Examples 3 and 17 to 20 and Comparative Examples 5 to 7 for comparison of the addition amounts of Mn. In Comparative Examples 5 and 6 in which the Mn contents were less than 0.12 parts by weight, the mechanical quality factors were low, i.e., lower than 400, and the driving efficiencies against the input power during driving were significantly low. The piezoelectric material of Comparative Example 7 contained an excessive amount of Mn and thereby had a small piezoelectric constant and a large dielectric loss of 0.6%.

Table 6 shows the piezoelectric constant, dielectric loss, force factor, and mechanical quality factor of each piezoelectric material of Examples 21 to 26 and Comparative Example 8 for comparison of the addition amounts of Mg. The piezoelectric material of Comparative Example 8 contained a large amount of Mg and thereby had a small mechanical quality factor not higher than 800 and also a small force factor not higher than 10 or.

In Comparative Example 9, the value of "a" was small, i.e., 0.999, and grains abnormally grew to an average

TABLE 5

|  | Piezoelectric constant $|d_{31}|$ [pC/N] | Dielectric loss [%] | Mechanical quality factor Qm |
|---|---|---|---|
| Example 3 | 92 | 0.3 | 950 |
| Example 17 | 87 | 0.3 | 1050 |
| Example 18 | 82 | 0.3 | 1150 |
| Example 19 | 79 | 0.4 | 1220 |
| Example 20 | 70 | 0.5 | 1270 |
| Comparative Example 5 | 102 | 0.2 | 220 |
| Comparative Example 6 | 95 | 0.2 | 390 |
| Comparative Example 7 | 62 | 0.6 | 1310 |

TABLE 6

|  | Piezoelectric constant $|d_{31}|$ [pC/N] | Dielectric loss [%] | Force factor $|d_{31} \times Y_{11}|$ [N/Vm] | Mechanical quality factor Qm |
|---|---|---|---|---|
| Example 21 | 85 | 0.2 | 10.80 | 1220 |
| Example 22 | 88 | 0.3 | 11.09 | 1320 |
| Example 23 | 90 | 0.3 | 11.25 | 1250 |
| Example 24 | 89 | 0.3 | 10.95 | 1150 |

TABLE 6-continued

| | Piezoelectric constant $|d_{31}|$ [pC/N] | Dielectric loss [%] | Force factor $|d_{31} \times Y_{11}|$ [N/Vm] | Mechanical quality factor Qm |
|---|---|---|---|---|
| Example 25 | 85 | 0.3 | 10.20 | 1000 |
| Example 26 | 82 | 0.3 | 9.84 | 900 |
| Comparative Example 8 | 79 | 0.4 | 8.52 | 750 |

Evaluation of Durability of Piezoelectric Element

In order to evaluate the durability of piezoelectric elements, the piezoelectric elements prepared in Examples 1 to 9 and 11 to 16 and the piezoelectric element for comparison prepared in Comparative Example 4 were placed in a thermostatic chamber and were subjected to a thermal cycle test of repeating a thermal cycle consisting of 25° C.→−20° C.→50° C.→25° C. for 100 times.

The piezoelectric constants $d_{31}$ before and after the thermal cycle test were evaluated. The rates of change in piezoelectric constant are shown in Table 7. The rate of change in piezoelectric constant is determined by [(piezoelectric constant $d_{31}$ after the test)−(piezoelectric constant $d_{31}$ before the test)]/(piezoelectric constant $d_{31}$ before the test)×100.

TABLE 7

| | Phase transition point | Piezoelectric constant $|d_{31}|$ before cycle test [pC/N] | Piezoelectric constant $|d_{31}|$ after cycle test [pC/N] | Change [%] |
|---|---|---|---|---|
| Example 1 | No | 88 | 84 | −4.1 |
| Example 2 | No | 105 | 101 | −3.8 |
| Example 3 | No | 92 | 88 | −3.9 |
| Example 4 | No | 85 | 83 | −2.8 |
| Example 5 | No | 94 | 91 | −3.7 |
| Example 6 | No | 83 | 81 | −2.3 |
| Example 7 | No | 95 | 93 | −2.5 |
| Example 8 | No | 110 | 106 | −3.6 |
| Example 9 | No | 115 | 110 | −4.1 |
| Example 11 | No | 75 | 73 | −2.2 |
| Example 12 | No | 70 | 68 | −2.6 |
| Example 13 | No | 75 | 72 | −3.7 |
| Example 14 | No | 65 | 63 | −2.8 |
| Example 15 | No | 68 | 65 | −3.7 |
| Example 16 | No | 70 | 67 | −4.5 |
| Comparative Example 4 | Yes | 125 | 98 | −21.5 |

The piezoelectric element of each Example showed a rate of reduction in piezoelectric properties was 5% or less, whereas the rate of reduction in Comparative Example 4 was significantly higher than 10% resulting in insufficient durability.

Production and Evaluation of Multilayered Piezoelectric Element

Example 27

Barium titanate, calcium titanate, and calcium zirconate powders equivalent to those used in Example 1 were weighed at a molar ratio of 81.3:12.7:6.0. In order to adjust the "a" showing the ratio of the molar amount of Ba and Ca at the A site to the molar amount of Ti and Zr at the B site, 0.017 mol of barium oxalate was added. In order to adjust the Mg content, magnesium oxide was added in an amount of 0.0049 parts by weight based on 100 parts by weight of the sum of weighed amounts (total amount) of barium titanate, calcium titanate, calcium zirconate, and barium oxalate. The mixture was mixed by dry blending with a ball mill for 24 hours.

Furthermore, manganese(II) acetate in an amount of 0.24 parts by weight as Mn on a metal basis and a PVA binder in an amount of 3 parts by weight each based on the sum of weighed amounts (total amount) of barium titanate, calcium titanate, calcium zirconate, and barium oxalate were added, followed by mixing. The resulting mixture had the same composition as that in Example 23. This mixed powder was formed into a green sheet having a thickness of 50 μm by a doctor blade method.

A conductive paste for an internal electrode was printed on the green sheet. A Ni paste was used as the conductive paste. Nine green sheets each provided with the conductive paste were stacked, and the resulting laminate was thermocompression bonded.

The thermocompression bonded laminate was fired in a tube furnace. The firing was performed in the air up to 300° C., the binder was then removed, and the firing was further continued in a reducing atmosphere ($H_2:N_2=2:98$, oxygen concentration: $2\times10^{-6}$ Pa) at 1380° C. for 5 hours. In the temperature lowering process, the oxygen concentration was changed to 30 Pa in the temperature from 1000° C. to room temperature.

The thus-prepared sintered compact was cut into a size of 10×2.5 mm. The side faces were ground, and a pair of external electrodes (a first electrode and a second electrode) for alternately short-circuiting the internal electrodes was formed by sputtering Au to produce a multilayered piezoelectric element as shown in FIG. 2B. The internal electrodes of the resulting multilayered piezoelectric element were observed, and it was confirmed that layers of Ni as the electrode material and layers of the piezoelectric material were alternately formed. The resulting multilayered piezoelectric element was set on a hot plate of a temperature of 60° C. to 100° C. and was polarized by application of an electric field of 1 kV/mm for 30 minutes. The resulting multilayered piezoelectric element had sufficient insulation properties and satisfactory piezoelectric properties such that piezoelectric constant $d_{31}$ was about six times or more that of the piezoelectric element in Example 23.

Comparative Example 11

A multilayered piezoelectric element was produced as in Example 27 except that the composition was that of Comparative Example 9. The piezoelectric material layer of the resulting multilayered piezoelectric element was observed, and several crystal grains having an average equivalent circular diameter of 40 to 50 μm were observed. Consequently, the element had very low strength not to allow evaluation of the piezoelectric properties.

Comparative Example 12

A multilayered piezoelectric element was produced as in Example 27 except that the composition was that of Comparative Example 8. The piezoelectric properties of the resulting multilayered piezoelectric element were evaluated.

The force factor and the mechanical quality factor were equivalent to or lower than those in Comparative Example 8.

Production and Evaluation of Device

Example 28

A liquid discharge head shown in FIGS. 3A and 3B was produced using the piezoelectric element of Example 9. Discharge of an ink according to input electric signals was confirmed.

Example 29

A liquid discharge device shown in FIG. 4 was produced using the liquid discharge head shown in FIGS. 3A and 3B having the piezoelectric element of Example 9. Discharge of an ink onto a transfer object according to input electric signals was confirmed.

Example 30

A liquid discharge head shown in FIGS. 3A and 3B was produced using the multilayered piezoelectric element of Example 27. Discharge of an ink according to input electric signals was confirmed.

Example 31

A liquid discharge device shown in FIG. 4 was produced using the liquid discharge head shown in FIGS. 3A and 3B having the multilayered piezoelectric element of Example 27. Discharge of an ink onto a transfer object according to input electric signals was confirmed.

Example 32

An ultrasonic motor shown in FIG. 6A was produced using the piezoelectric element in Example 22. Rotation behavior of the motor according to application of an alternating voltage was confirmed.

Example 33

An optical apparatus shown in FIG. 8 was produced using the ultrasonic motor having the piezoelectric element in Example 22. Autofocus operation according to application of an alternating voltage was confirmed.

Example 34

An ultrasonic motor shown in FIG. 6B was produced using the multilayered piezoelectric element in Example 27. Rotation behavior of the motor according to application of an alternating voltage was confirmed.

Example 35

A dust-removing device shown in FIGS. 9A and 9B was produced using the piezoelectric element in Example 23. A satisfactory dust removing efficiency was confirmed by dispersing plastic beads and applying an alternating voltage thereto.

Example 36

A dust-removing device shown in FIGS. 9A and 9B was produced using the multilayered piezoelectric element in Example 27. A satisfactory dust removing efficiency was confirmed by dispersing plastic beads and applying an alternating voltage thereto.

Example 37

An image pickup device shown in FIG. 13 was produced using the dust-removing device having the piezoelectric element in Example 23 and an image pickup element unit. In the operation of the device, dust on the surface of the image pickup unit was satisfactorily removed to provide a dust defect-free image.

Example 38

An electronic apparatus shown in FIG. 14 was produced using a piezoelectric acoustic component having the piezoelectric element in Example 9. Loudspeaker operation according to application of an alternating voltage was confirmed.

The piezoelectric material of the present invention gas a satisfactory and stable piezoelectric constant and mechanical quality factor in a wide practical use temperature range. In addition, since the piezoelectric material does not contain lead, its load on the environment is low. Accordingly, the piezoelectric material of the invention can be used in various apparatuses including a large amount of the piezoelectric material, such as liquid discharge heads, liquid discharge devices, ultrasonic motors, optical apparatuses, vibratory devices, dust-removing devices, image pickup devices, and electronic apparatuses, without any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-242894 filed Nov. 2, 2012, which is hereby incorporated by reference herein in its entirety.

What is claimed is:

1. A piezoelectric material comprising:
   a perovskite-type metal oxide represented by Formula (1): $(Ba_{1-x}Ca_x)_a(Ti_{1-y}Zr_y)O_3$ (wherein, 1.00a 1.01, 0.125x 0.300, and 0.041y 0.074);
   Mn; and
   Mg, wherein
   the content of Mn is 0.12 parts by weight or more and 0.40 parts by weight or less based on 100 parts by weight of the perovskite-type metal oxide on a metal basis;
   the content of Mg is 0.10 parts by weight or less and 0.0005 parts by weight or more based on 100 parts by weight of the perovskite-type metal oxide on a metal basis, and the piezoelectric material is polarized.

2. The piezoelectric material according to claim 1, wherein the content of Mg is 0.05 parts by weight or less based on 100 parts by weight of the perovskite-type metal oxide on a metal basis.

3. The piezoelectric material according to claim 1, wherein the piezoelectric material does not have a structural phase transition point within a range of −25° C. to 100° C.

4. The piezoelectric material according to claim 1, wherein crystal grains constituting the piezoelectric material have an average equivalent circular diameter of 1 μm or more and 10 μm or less.

5. The piezoelectric material according to claim 1, wherein the piezoelectric material has a relative density of 93% or more and 100% or less.

6. A piezoelectric element comprising:
a first electrode;
a piezoelectric material; and
a second electrode, wherein
the piezoelectric material is a piezoelectric material according to claim 1.

7. A multilayered piezoelectric element comprising:
alternately stacked piezoelectric material layers and electrode layers including an internal electrode, wherein
the piezoelectric material layers are made of a piezoelectric material according to claim 1.

8. A liquid discharge head comprising:
a liquid chamber provided with a vibratory unit including a piezoelectric element according to claim 6; and
a discharge port communicating with the liquid chamber.

9. A liquid discharge device comprising:
a conveying unit for conveying a transfer object; and
a liquid discharge head according to claim 8.

10. An ultrasonic motor comprising:
a vibratory component provided with a piezoelectric element according to claim 6; and
a movable component being in contact with the vibratory component.

11. An optical apparatus comprising:
a diving unit including an ultrasonic motor according to claim 10.

12. A vibratory device comprising:
a vibratory component provided with a piezoelectric element according to claim 6.

13. A dust-removing device comprising:
a diaphragm provided with a vibratory unit including a vibratory device according to claim 12.

14. An image pickup device comprising:
a dust-removing device according to claim 13; and
an image pickup element unit, wherein
the diaphragm of the dust-removing device and the light-receiving surface of the image pickup element unit are disposed on the same axis; and
the dust-removing device is disposed on the light-receiving surface side of the image pickup element unit.

15. An electronic apparatus comprising:
a piezoelectric acoustic component provided with a piezoelectric element according to claim 6.

16. A liquid discharge head comprising:
a liquid chamber provided with a vibratory unit including a multilayered piezoelectric element according to claim 7; and
a discharge port communicating with the liquid chamber.

17. A liquid discharge device comprising:
a conveying unit for conveying a recording medium; and
a liquid discharge head according to claim 16.

18. An ultrasonic motor comprising:
a vibratory component provided with a multilayered piezoelectric element according to claim 7; and
a movable component being in contact with the vibratory component.

19. An optical apparatus comprising:
a driving unit including an ultrasonic motor according to claim 18.

20. A vibratory device comprising:
a vibratory component provided with a multilayered piezoelectric element according to claim 7.

21. A dust-removing device comprising:
a diaphragm provided with a vibratory unit including a vibratory device according to claim 20.

22. An image pickup device comprising:
a dust-removing device according to claim 21; and
an image pickup element unit, wherein
the diaphragm of the dust-removing device and the light-receiving surface of the image pickup element unit are disposed on the same axis; and
the dust-removing device is disposed on the light-receiving surface side of the image pickup element unit.

23. An electronic apparatus comprising:
a piezoelectric acoustic component provided with a multilayered piezoelectric element according to claim 7.

* * * * *